(12) United States Patent
Bierhuizen et al.

(10) Patent No.: US 10,249,807 B2
(45) Date of Patent: Apr. 2, 2019

(54) PRE-ROTATED OVERMOULDED BIDIRECTIONAL SPREADING LENS FOR STRETCHED LEADFRAME ARCHITECTURE

(71) Applicant: Lumileds LLC, San Jose, CA (US)

(72) Inventors: Serge Joel Armand Bierhuizen, San Jose, CA (US); Giovanni Cennini, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/005,299

(22) Filed: Jun. 11, 2018

(65) Prior Publication Data

US 2018/0358525 A1 Dec. 13, 2018

Related U.S. Application Data

(63) Continuation of application No. 14/387,868, filed as application No. PCT/IB2013/052429 on Mar. 27, 2013, now Pat. No. 9,997,684.

(Continued)

(51) Int. Cl.
*H01L 33/62* (2010.01)
*F21K 9/90* (2016.01)
(Continued)

(52) U.S. Cl.
CPC ............... *H01L 33/62* (2013.01); *F21K 9/27* (2016.08); *F21K 9/90* (2013.01); *H01L 25/13* (2013.01);
(Continued)

(58) Field of Classification Search
CPC ... F21K 9/17; F21K 9/90; H01L 33/62; H01L 33/60; H01L 25/13; H01L 33/005;
(Continued)

(56) References Cited

U.S. PATENT DOCUMENTS 5,174,649 A   12/1992  Alston
7,473,014 B2   1/2009  Katoh et al.
(Continued)

FOREIGN PATENT DOCUMENTS

CN    1306621    3/2007
EP    2400206    12/2011
(Continued)

OTHER PUBLICATIONS

JP Office Action, Application 2015-502527, dated Jan. 10, 2017, 8 pages.
(Continued)

*Primary Examiner* — Hrayr A Sayadian
(74) *Attorney, Agent, or Firm* — Volpe and Koenig, P.C.

(57) ABSTRACT

A solid state light-emitting device (LED) lighting apparatus comprising a leadframe assembly comprising leadframes spaced apart at a pitch, each leadframe comprising at least one pad, interconnects each linking two adjacent leadframes, LEDs mounted on the leadframes, and bidirectional spreading lenses disposed about the LEDs, each bidirectional spreading lens having a spreading axis and a null axis perpendicular to the spreading axis, each bidirectional spreading lens directing more light in opposite directions along the spreading axis than the null axis, the spreading axis being aligned along the length of the stretched leadframe assembly.

11 Claims, 20 Drawing Sheets

Related U.S. Application Data

(60) Provisional application No. 61/617,689, filed on Mar. 30, 2012.

(51) Int. Cl.
| | |
|---|---|
| *F21K 9/27* | (2016.01) |
| *H01L 33/60* | (2010.01) |
| *H01L 33/58* | (2010.01) |
| *H01L 25/13* | (2006.01) |
| *H01L 33/00* | (2010.01) |
| *F21Y 115/10* | (2016.01) |
| *F21Y 103/10* | (2016.01) |
| *F21V 7/00* | (2006.01) |

(52) U.S. Cl.
  CPC ............ *H01L 33/005* (2013.01); *H01L 33/58* (2013.01); *H01L 33/60* (2013.01); *F21V 7/005* (2013.01); *F21Y 2103/10* (2016.08); *F21Y 2115/10* (2016.08); *H01L 2924/0002* (2013.01); *H01L 2933/0058* (2013.01); *H01L 2933/0066* (2013.01)

(58) Field of Classification Search
  CPC ............ H01L 33/58; H01L 2933/0058; H01L 2933/0066; H01L 2924/0002; H01L 2924/00; F21V 7/005; F21Y 2101/02; F21Y 2103/003; F21Y 2103/10; F21Y 2115/10
  USPC .............................................. 257/88; 438/27
  See application file for complete search history.

(56) References Cited

U.S. PATENT DOCUMENTS

| 9,997,684 | B2 | 6/2018 | Bierhuizen et al. |
| 2004/0037080 | A1 | 2/2004 | Luk et al. |
| 2004/0252501 | A1 | 12/2004 | Moriyama et al. |
| 2006/0164853 | A1 | 7/2006 | Moisel |
| 2008/0002100 | A1 | 1/2008 | Kaneko et al. |
| 2009/0002985 | A1 | 1/2009 | Peck et al. |
| 2010/0072507 | A1 | 3/2010 | Huang et al. |
| 2010/0165623 | A1 | 7/2010 | Bremerich et al. |
| 2010/0220046 | A1 | 9/2010 | Plotz et al. |
| 2012/0051052 | A1 | 3/2012 | Wagatsuma et al. |
| 2012/0061695 | A1 | 3/2012 | Kim |
| 2012/0199852 | A1 | 8/2012 | Lowes et al. |
| 2012/0300456 | A1 | 11/2012 | Phillips, III et al. |
| 2013/0294092 | A1* | 11/2013 | Hussell ................. F21V 29/004 362/363 |
| 2014/0117386 | A1 | 5/2014 | Rol et al. |

FOREIGN PATENT DOCUMENTS

| JP | 2005-063995 | 3/2005 |
| JP | 2006-041379 | 2/2006 |
| JP | 2007-112299 | 5/2007 |
| WO | 2010/094141 | 8/2010 |
| WO | 2010/095424 | 8/2010 |
| WO | 2013/144858 | 10/2013 |

OTHER PUBLICATIONS

EPO as ISA, PCT/182013/052429 filed Mar. 27, 2013, "International Search Report and Written Opinion", dated Jul. 18, 2013, 8 pages.

Office Action for EP Application No. 13722087.7, dated Nov. 13, 2015, 4 pages.

First Office Action dated Apr. 18, 2017, China Patent Application No. 201380018265.8, 23 pages.

\* cited by examiner

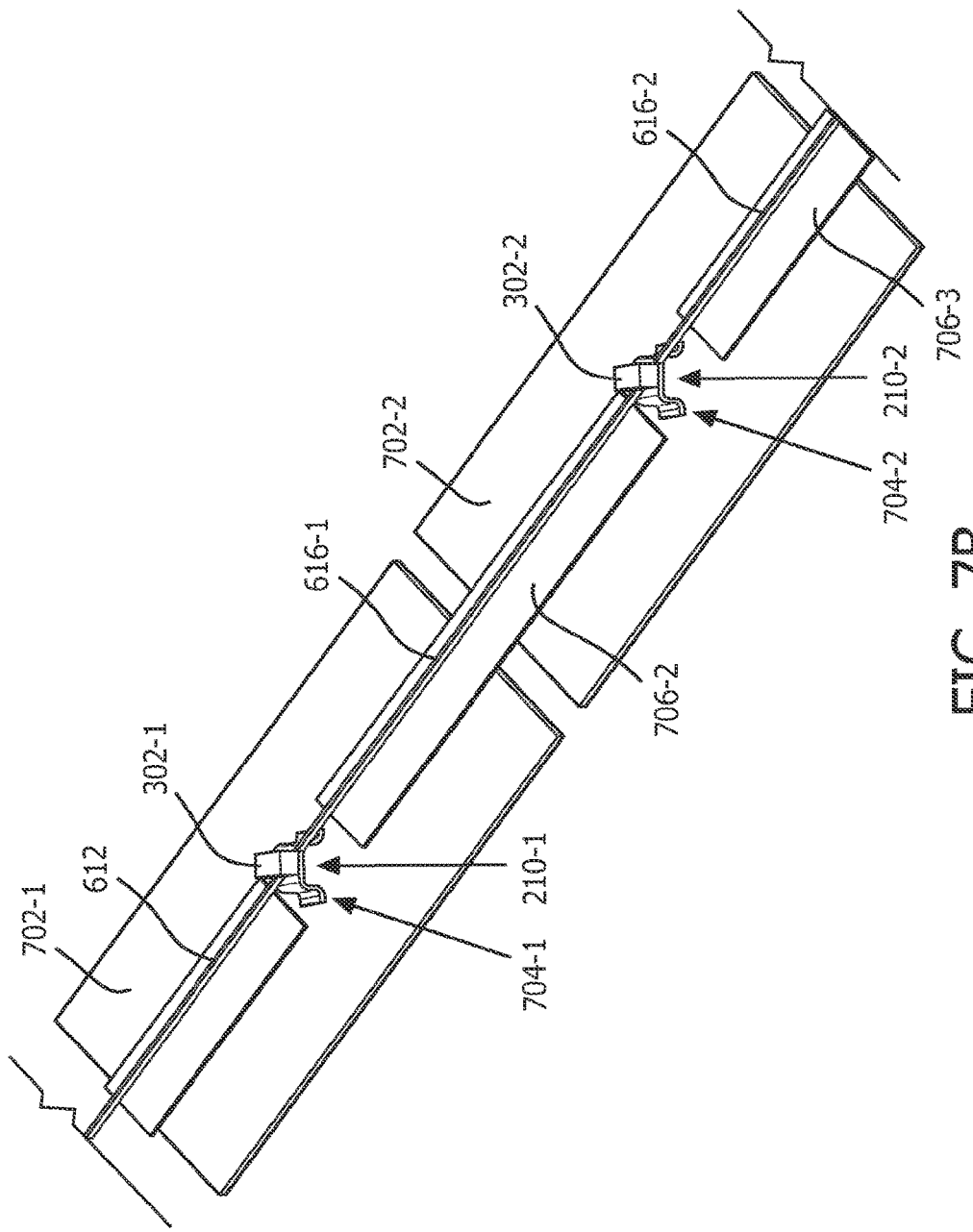

PRE-ROTATED OVERMOULDED BIDIRECTIONAL SPREADING LENS FOR STRETCHED LEADFRAME ARCHITECTURE

FIELD OF THE INVENTION

The present invention relates to architecture for linear lighting applications with large pitches or spaces between solid state light-emitting devices (LEDs), such as LED retrofit tube lamps for replacing fluorescent tube lamps.

BACKGROUND

Light-emitting device (LED) lamps are replacing florescent lamps in many lighting applications. LED lamps offer longer life, greater energy efficiency, and flicker-free lighting. LED lamps also do not contain mercury and do not interfere with precision instruments.

Fluorescent tube lamps are commonly used to provide ambient lighting in large indoor areas. These tube lamps are typically 2 to 8-feet long. For an equivalent LED retrofit tube lamp, a dense array of LEDs is mounted on a long printed circuit board (PCB). Both the number of the LEDs and the length of the PCB add to the cost of the LED tube lamp. Thus, what is needed is a new architecture for linear lighting applications with large pitches or spaces between LEDs.

SUMMARY

A method for manufacturing a solid state light-emitting device (LED) lighting apparatus includes forming a leadframe assembly which is a group of leadframes connected in series by folded interconnects. LEDs are then mounted on the leadframes, along with disposing optical elements about the LEDs. The leadframe assembly is then stretched so the interconnects unfold to distribute the LEDs spatially. Disposing (positioning) the optical elements about the LEDs includes orienting the optical elements so the optical elements provide a predetermined light pattern after stretching the leadframe assembly.

BRIEF DESCRIPTION OF THE DRAWINGS

In the drawings:

FIG. 7B is an isometric view of two sections of the stretched leadframe assembly and the reflectors of FIG. 7A;

Use of the same reference numbers in different figures indicates similar or identical elements.

DETAILED DESCRIPTION

Figure 1:
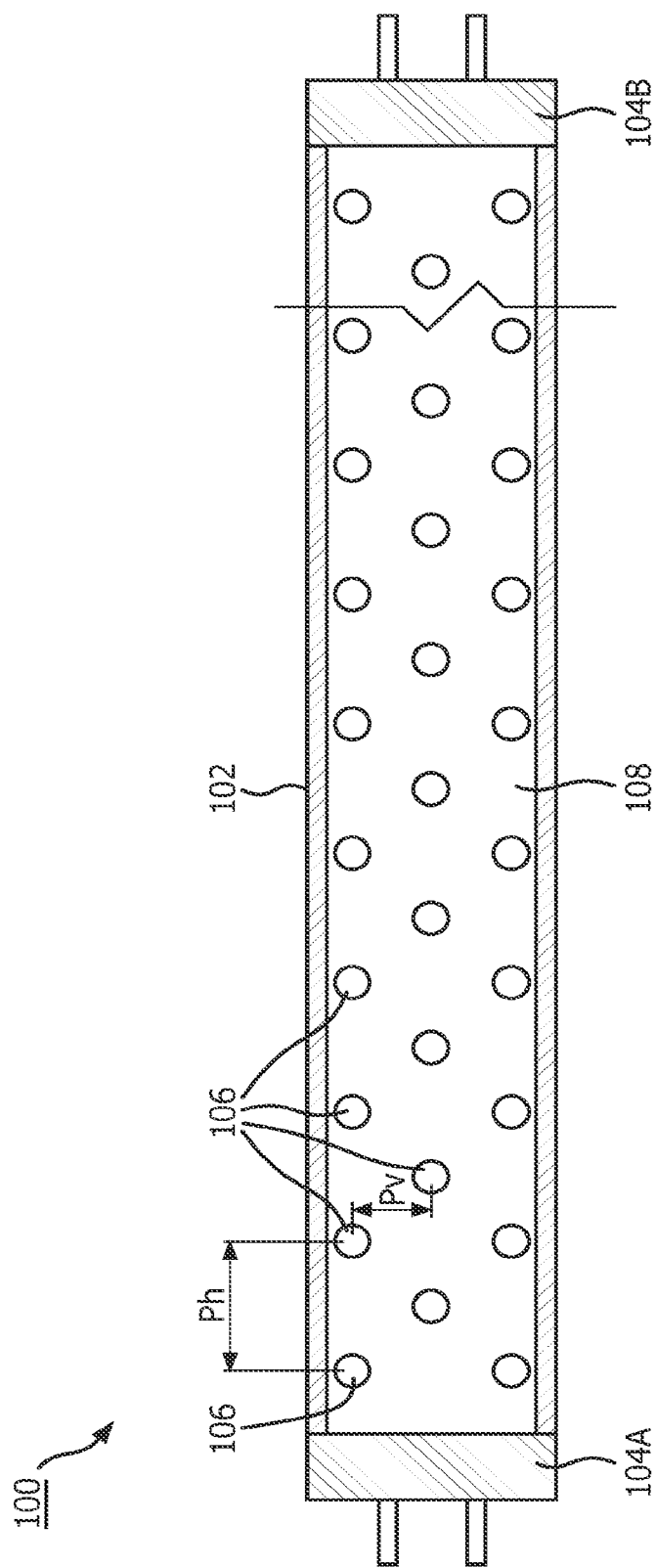
FIG. 1 is a top cutaway view of a conventional light-emitting diode tube lamp with an array of light-emitting diodes mounted on a printed circuit board.

FIG. 1 is a top cutaway view of a conventional solid state light-emitting diode tube lamp 100. Tube lamp 100 has the form factor of a standard straight fluorescent tube lamp, such as a T5, T8, or T12 fluorescent tube lamp or any other suitable lamp. Tube lamp 100 includes a glass tube 102 and bi-pin connectors 104A, 104B mounted on the two ends of the glass tube so the tube lamp can connect to standard fluorescent lighting fixtures. Although a standard fluorescent tube lamp is shown, any other dispersed use of LEDs is contemplated and included within the scope of the invention.

An array of light-emitting diodes 106 (only some are labeled) is mounted on a large printed circuit board (PCB) 108 that runs along the length of glass tube 102. The array typically consists of three staggered rows of light-emitting diodes 106, but any suitable arrangement for dispersing light is contemplated and included within the scope of the invention. To avoid a spotty appearance, the horizontal pitch Ph and the vertical pitch Pv between light-emitting diodes 106 are controlled to provide the appearance of a single, uniformly lit light source. With typical pitches Ph and Pv of about 0.5 inch, about 300 light-emitting diodes are required for a typical 4-foot long tube lamp 100. Alternate rows may be offset, for instance alternate rows may be displaced at half the pitch Ph.

PCB 108 connects light-emitting diodes 106, in series or in parallel or a combination of serial strings of LEDs driven in parallel, to an external power source. PCB 108 has an area roughly equal to the product of the diameter and the length of glass tube 102. Although relatively simple in construction, PCB 108 has a very large area compared to many LED applications. The large number of light-emitting diodes 106 and the large area of PCB 108 all add to the cost of tube lamp 100.

A stretchable leadframe assembly may be used in place of PCB 108. The leadframe assembly includes leadframes that are connected in series, both mechanically and electrically, by folded interconnects. Each leadframe includes an anode pad and a cathode pad. Once light sources are attached to the leadframes, the leadframe assembly is stretched to distribute the light sources spatially. The small area of the folded interconnects saves material and processing space compared to a conventional PCB.

Figure 2A:
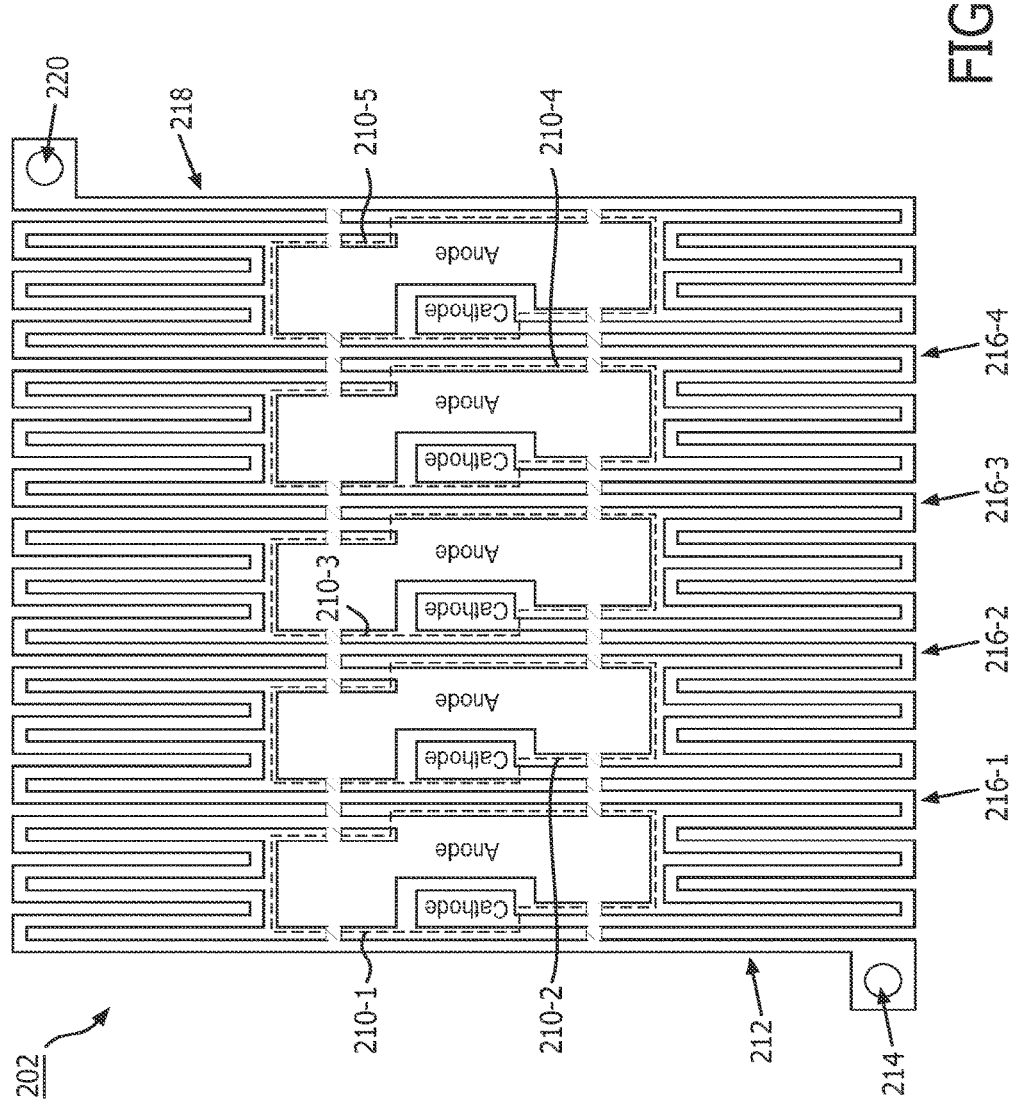
FIG. 2A is a top view of a leadframe assembly.

FIG. 2A illustrates a top view of a leadframe assembly 202 in one or more embodiments of the present invention. Leadframe assembly 202 is in a folded configuration typically used early in the manufacturing process. Later leadframe assembly 202 is stretched into a different configuration for placement in a light-emitting diode tube lamp. The following description uses an orientation of the leadframe segments where a stretch hole 214 is at the lower left corner of leadframe assembly 202. The term segment refers to any typical straight member of leadframe assembly 202.

Leadframe assembly 202 includes a group of leadframes 210-1, 210-2, 210-3, 210-4, and 210-5. For example, leadframes 210-1 to 210-5 are linearly arranged in a row going from left to right. Each leadframe includes a rectangular cathode pad and a larger anode pad cut out to partially surround the cathode pad. Starting from the left side of FIG. 2A, a folded interconnect 212 has a stretch hole 214 at a leftmost end and a rightmost end connected to the anode pad of leadframe 210-1. Folded interconnect 212 includes a vertical segment typically located to the left of leadframe 210-1 and a folded section of segments typically located at the top of leadframe 210-1.

Each pair of adjacent leadframes are connected by a folded interconnect. Leadframes 210-1 is connected by a folded interconnect 216-1 to leadframe 210-2. Folded interconnect 216-1 includes a leftmost end connected to the cathode pad of leadframe 210-1 and a rightmost end connected to the anode pad of leadframe 210-2. Folded interconnect 216-1 includes a first folded section of segments typically located at the bottom of leadframe 210-1, a vertical segment typically located between leadframes 210-1 and 210-2, and a second folded section of segments typically located at the top of leadframe 210-2.

Leadframe 210-2 is connected by a folded interconnect 216-2 to leadframe 210-3, which is connected by a folded interconnect 216-3 to leadframe 210-4, which is connected by a folded interconnect 216-4 to leadframe 210-5. Folded interconnects 216-2, 216-3, and 216-4 are configured similarly to folded interconnect 216-1.

Folded interconnect 218 has a leftmost end connected to the cathode pad of leadframe 210-5 and a stretch hole 220 at a rightmost end. Folded interconnect 218 includes a folded section of segments typically located at the bottom of leadframe 210-5 and a vertical segment typically located to the right of leadframe 210-5. Depending on the specific application, leadframe assembly 202 may include a greater or lesser number of leadframes and folded interconnect elements (e.g., leadframes 210-1 to 210-$n$ where n is a variable).

Figure 2B:
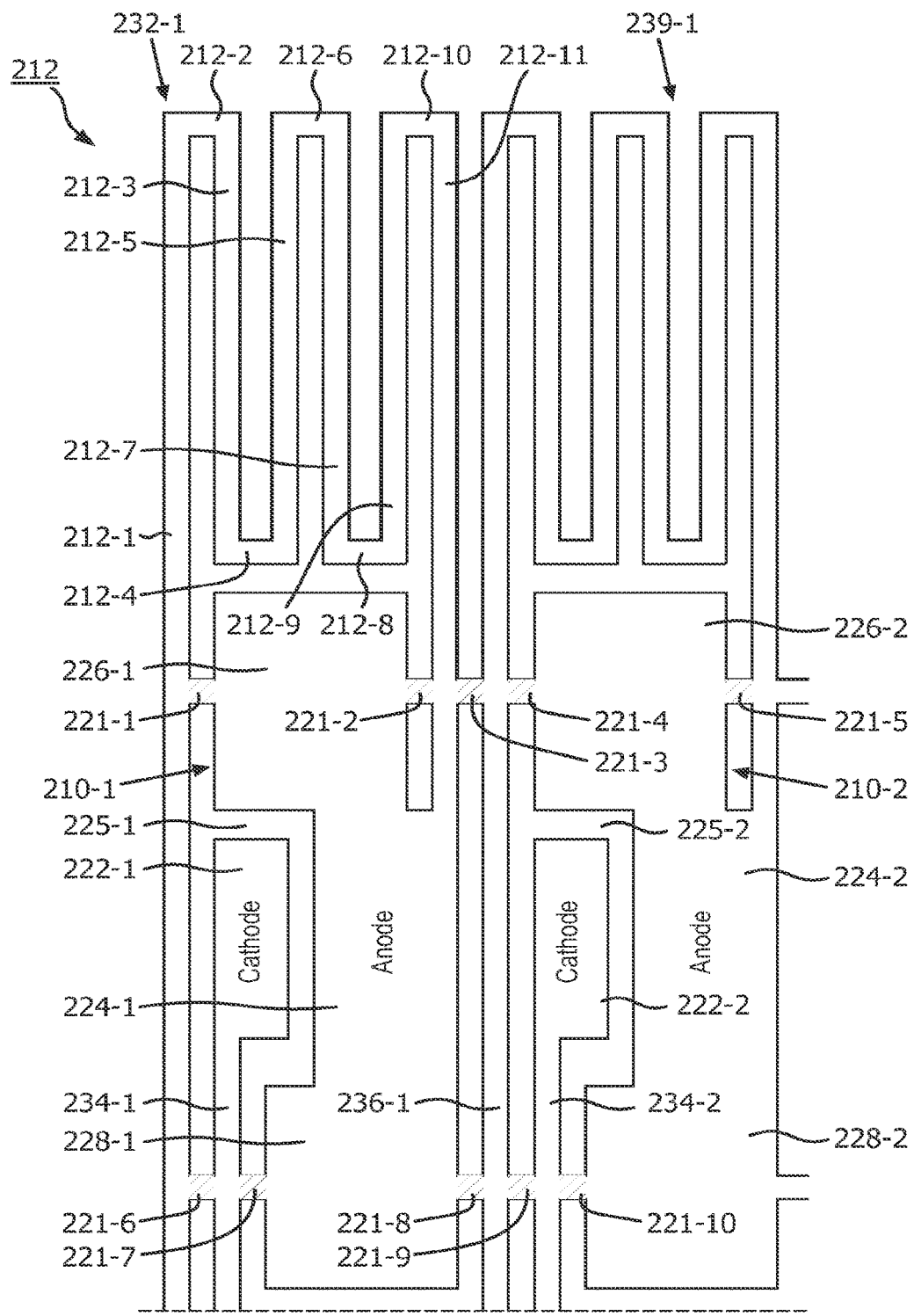
FIGS. 2B and 2C combine to form a top view of the first and the second leadframes in the leadframe assembly of FIG. 2A.
Figure 2C:
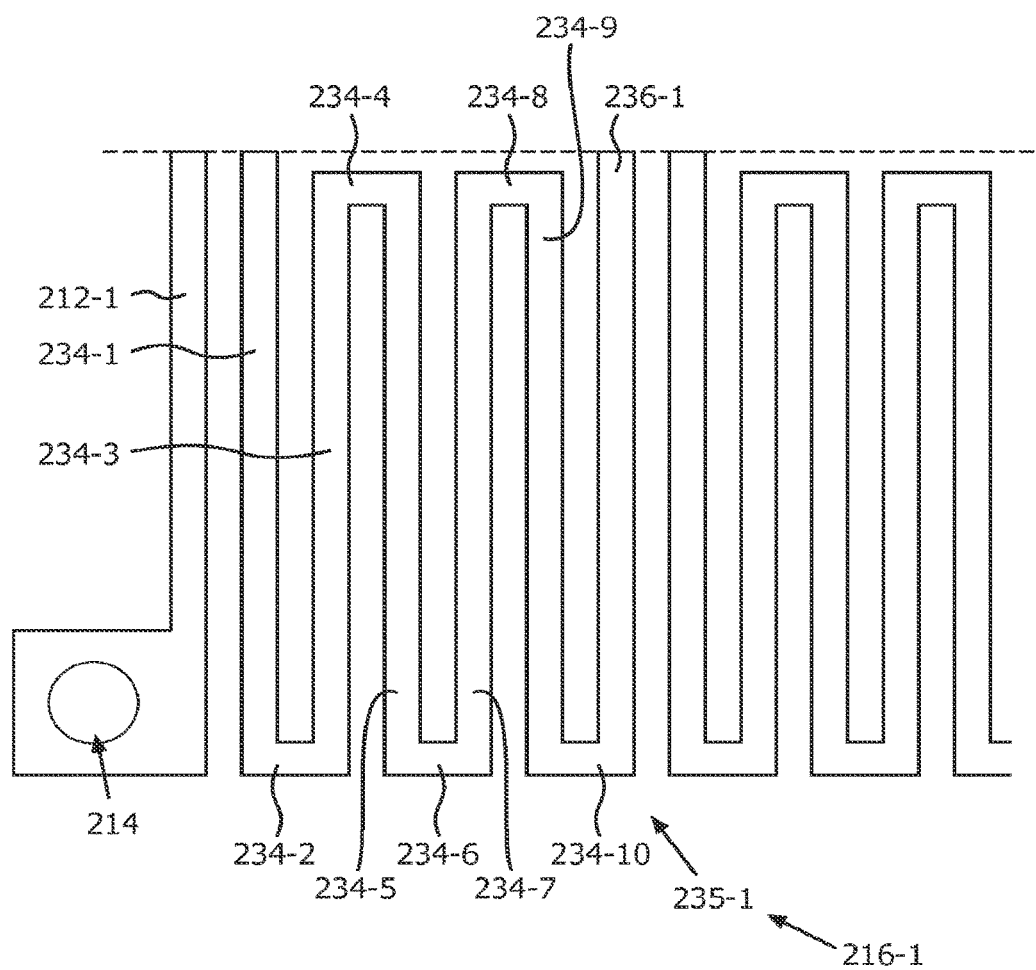

FIGS. 2B and 2C combine to illustrate a top view of leadframes 210-1 and 210-2 in one or more embodiments of the present invention. Leadframe 210-1 includes a cathode pad 222-1 and an anode pad 224-1. Cathode pad 222-1 may be rectangular and anode pad 224-1 may be generally rectangular with a cutout 225-1 that fits around the cathode pad. Anode pad 224-1 includes an upper wing area 226-1 above cutout 225-1 and a lower wing area 228-1 below cutout 225-1. Wing areas 226-1 and 228-1 are later bent to form a gull wing mount. Like leadframe 210-1, leadframe 210-2 includes a cathode pad 222-2 and an anode pad 224-2 with a cutout 225-2 and wing areas 226-2, 228-2. Leadframes 210-3 to 210-5 (FIG. 2A) are configured similarly to leadframes 210-1 and 210-2.

As described above, a folded interconnect 212 is connected to leadframe 210-1. Folded interconnect 212 includes a vertical segment 212-1 typically located to the left of leadframe 210-1. Vertical segment 212-1 has stretch hole 214 at one end and another end connected to a top folded section 232-1.

Top folded section 232-1 is shaped like a rectangular waveform, has one end connected to vertical segment 212-1, and another end connected to anode pad 224-1 of leadframe 210-1. Top folded section 232-1 includes a horizontal segment 212-2 extending rightward from segment 212-1 to connect to a vertical segment 212-3 which extends downward to connect to a horizontal segment 212-4. Horizontal segment 212-4 extends rightward to connect to a vertical segment 212-5, which extends upward to connect to a horizontal segment 212-6. Horizontal segment 212-6 extends rightward to connect to a vertical segment 212-7, which extends downward to connect to a horizontal segment 212-8. Horizontal segment 212-8 extends rightward to connect to a vertical segment 212-9, which extends upward to connect to a horizontal segment 212-10. Horizontal segment 212-10 extends rightward to connect to a vertical segment 212-11, which extends downward to connect to anode pad 224-1 of leadframe 210-1. In the alternative, the top folded section of folded interconnect 212 may have the shape of a sinusoidal waveform, saw tooth waveform or any other suitable shape.

As described above, leadframe 210-1 is connected by folded interconnect 216-1 to leadframe 210-2. Folded interconnect 216-1 includes a bottom folded section 235-1 typically located at the bottom of leadframe 210-1, a vertical segment 236-1 typically located between leadframes 210-1 and 210-2, and a top folded section 239-1 typically located at the top of leadframe 210-2. Bottom folded section 235-1 is shaped like a rectangular waveform, has one end connected to cathode pad 222-1 of leadframe 210-1, and another end connected to vertical segment 236-1. Bottom folded section 235-1 has a vertical segment 234-1 extending downward to connect to a horizontal segment 234-2, which extends rightward to connect to a vertical segment 234-3. Vertical segment 234-3 extends upward to connect to a horizontal segment 234-4, which extends rightward to connect to a vertical segment 234-5. Vertical segment 234-5 extends downward to connect to a horizontal segment 234-6, which extends rightward to connect to a vertical segment 234-7. Vertical segment 234-7 extends upward to connect to a horizontal segment 234-8, which extends rightward to connect to a vertical segment 234-9. Vertical segment 234-9 extends downward to connect to a horizontal segment 234-10, which extends rightward to connect to vertical segment 236-1. In the alternative, folded section 235-1 may have the shape of a sinusoidal waveform, sawtooth waveform or any other suitable shape.

Vertical segment 236-1 passes between leadframes 210-1 and 210-2. Vertical segment 236-1 has a lower end connected to bottom folded section 235-1 and an upper end connected to top folded section 239-1.

Top folded section 239-1 is shaped like a rectangular waveform, has one end connected to vertical segment 236-1, and another end connected to anode pad 224-2 of leadframe 210-2. Top folded section 239-1 is configured similarly to top folded section 232-1 of folded interconnect 212.

Leadframe assembly 202 includes sacrificial ties, which are collectively referred to as sacrificial ties 221, that connect portions of a folded interconnect to other portions of same or different folded interconnect or to an anode or cathode pad. Sacrificial ties 221 add stiffness to leadframe assembly 202 so that it is sufficiently rigid for handling during the manufacturing process. Sacrificial ties 221 are later removed so the folded interconnects 212, 216-1 to 216-4, and 218 (FIG. 2A) may unfold to distribute leadframes 210-1 to 210-5.

In FIG. 2B, sacrificial ties 221 are shown as crosshatched areas even though they are typically created by the same process as is used to create all of folded interconnects 212, 216-1 to 216-4, and 218. The crosshatching is used only to distinguish sacrificial ties 221 in the figures from the portions of leadframe assembly 202 that remain after processing.

In FIG. 2B, sacrificial tie 221-1 connects segment 212-1 to upper wing area 226-1. Sacrificial tie 221-2 connects upper wing area 226-1 to segment 212-11. Sacrificial tie 221-3 connects segment 212-11 to segment 236-1. Sacrificial tie 221-4 connects segment 236-1 to upper wing area 226-2. Sacrificial tie 221-5 connects upper wing area 226-2 to vertical segment 239-1. Sacrificial tie 221-6 connects segment 212-1 to segment 234-1. Sacrificial tie 221-7 connects segment 234-1-to lower wing area 228-1. Sacrificial tie 221-8 connects lower wing area 228-1 to segment 236-1. Sacrificial tie 221-9 connects segment 236-1 to a segment 234-2. Sacrificial tie 221-10 connects segment 234-2 to lower wing area 228-2.

Folded interconnects 216-2, 216-3, and 216-4 (FIG. 2A) are configured similarly to folded interconnect 216-1.

Figure 2D:
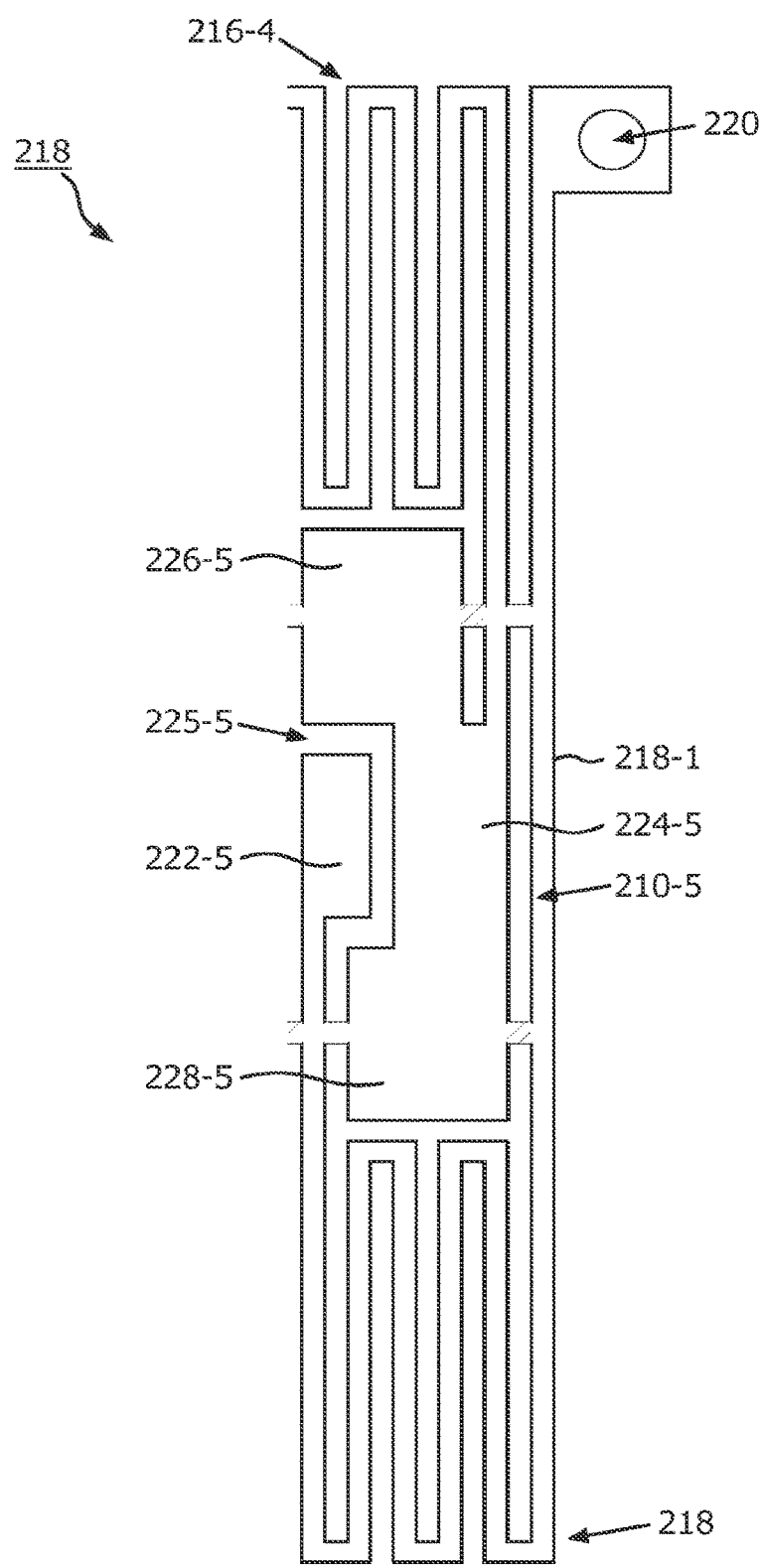
FIG. 2D is a top view of the last leadframe in the leadframe assembly of FIG. 2A.

FIG. 2D illustrates a top view of leadframe 210-5 in one or more embodiments of the present invention. Leadframe 210-5 includes a cathode pad 222-5 and an anode pad 224-5 with a cutout 225-5 and wing areas 226-5, 228-5.

As described above, leadframe 210-5 is connected to folded interconnect 218 with stretch hole 220 at its end. Folded interconnect 218 includes a bottom folded section typically located at the bottom of leadframe 210-5 and a vertical segment 218-1 typically located to the right of leadframe 210-5. Folded interconnect 218 is substantially folded interconnect 212 in the reverse configuration.

Figure 3:
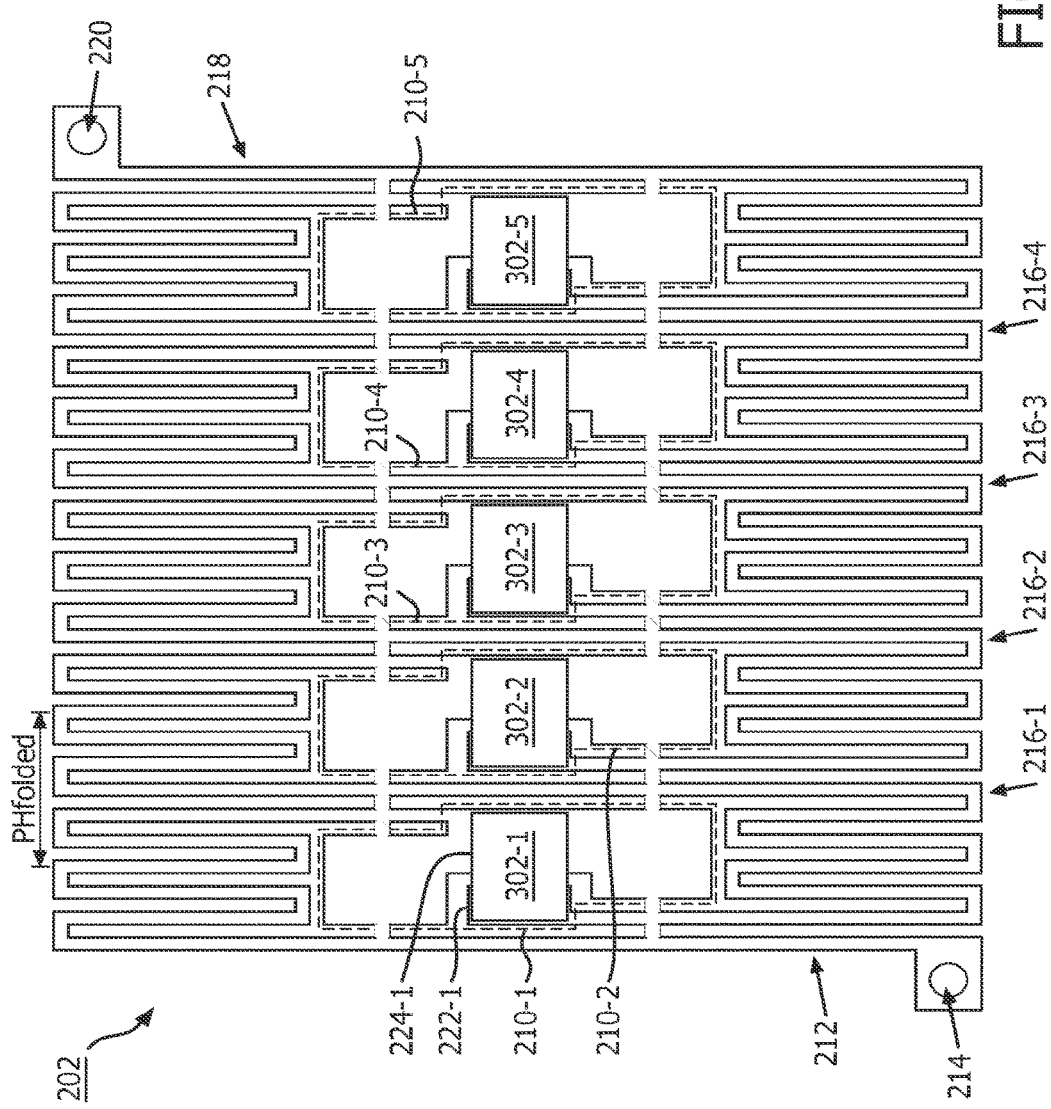
FIG. 3 is a top view of light sources attached to the leadframes in the leadframe assembly of FIG. 2A.

FIG. 3 shows light sources 302-1, 302-2, 302-3, 302-4, and 302-5 are soldered or otherwise electrically connected to leadframes 210-1 to 210-5, respectively, in one or more embodiments of the present invention. When connected to leadframes 210-1 to 210-5, LEDs 302-1 to 302-5 are spaced with a horizontal pitch of PHfolded. The attachment of a light source to a leadframe mechanically binds the cathode and the anode pads of the leadframe together even after sacrificial ties 221 (shown as hatched segments in FIGS. 2A and 2B) are removed. Light sources 302-1 to 302-5 may be solid state light-emitting devices (LEDs).

Figure 4:
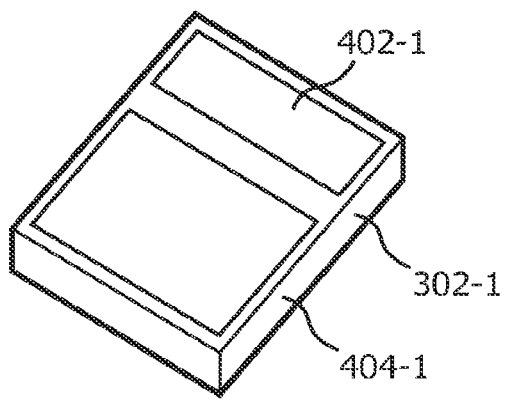
FIG. 4 is an isometric view of a light-emitting device (LED)

FIG. 4 shows that exemplary LED 302-1 has a cathode pad 402-1 and an anode pad 404-1 that corresponds to cathode pad 222-1 and anode pad 224-1, respectively, of leadframe 210-1 (FIG. 3) in one or more embodiments of the present invention. The cathode pad 402-1 and anode pad 404-1 may or may not be shaped to the same dimensions as cathode pad 222-1 and anode pad 224-1 of leadframe 210-1. In an alternative, cathode pad 402-1 may be approximately the shape of the center of anode pad 224-1. Referring back to FIG. 3, the cathode and anode pads of LEDs 302-2 to 302-5 are configured similarly to the pads of LED 302-1.

LEDs 302-1 to 302-5 may be naked light-emitting diode dice or prepackaged light-emitting diodes (e.g., in chip scale packages). A prepackaged light-emitting diode has a naked light-emitting diode die mounted on a submount or interposer. The submount includes a ceramic substrate, a metal interconnect layer, and various pads. The ceramic substrate provides mechanical support and thermally connects the light-emitting diode die to a thermal pad on the bottom of the ceramic substrate. The metal interconnect layer connects the light-emitting diode die to a cathode pad and an anode pad on the bottom of the ceramic substrate. The prepackaged light-emitting diode die may or may not be encapsulated.

Figure 5:
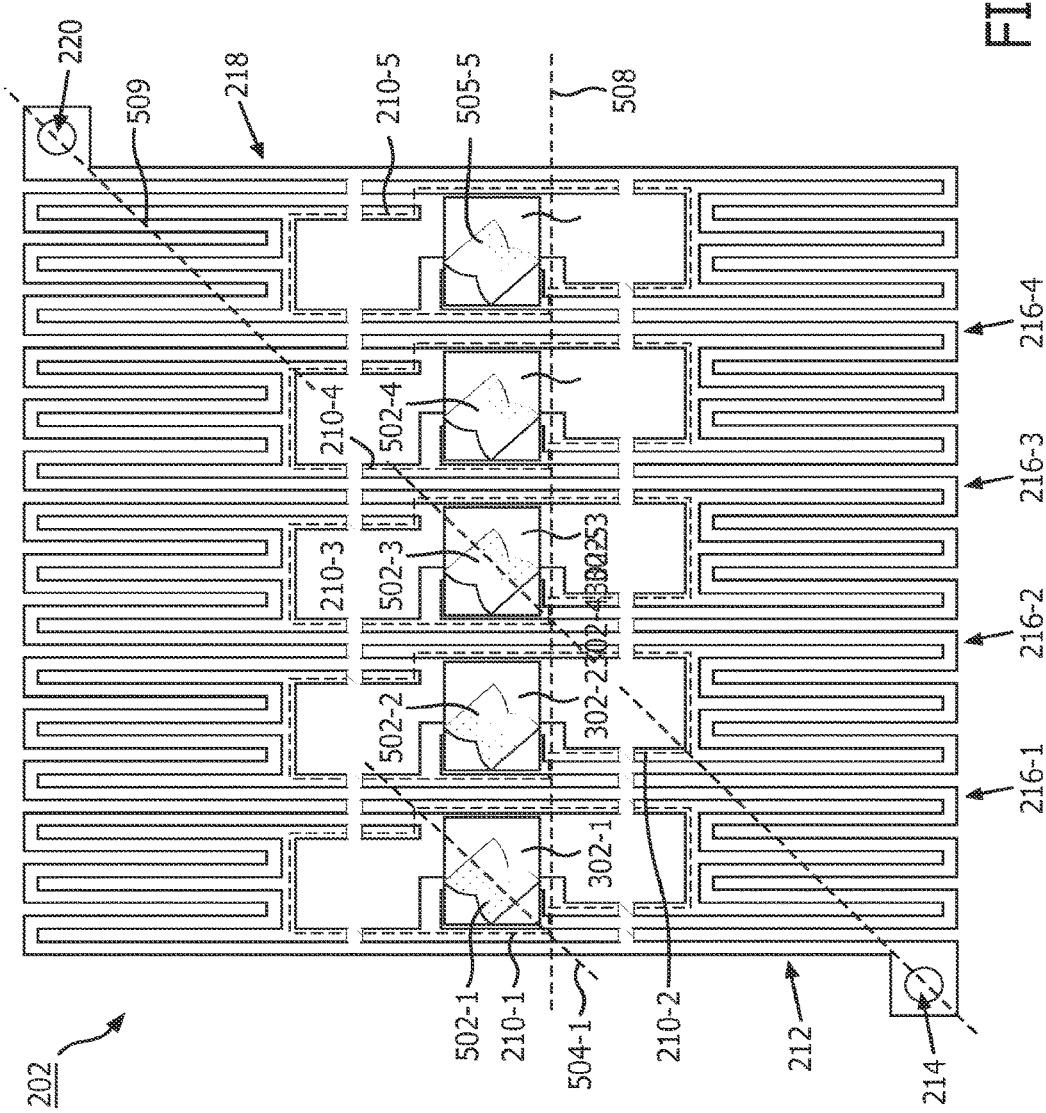
FIG. 5 is a top view of one type of optical elements disposed about the LEDs on the leadframe assembly of FIG. 3.

Once leadframe assembly 202 is stretched, a sparse arrangement of LEDs 302-1 to 302-5 may result in a tube lamp with a spotty appearance where the LEDs produce bright spots separated by dark regions along the length of the tube lamp. FIG. 5 shows optical elements 502-1, 502-2, 502-3, 502-4, and 502-5 disposed about LEDs 302-1 to 302-5, respectively, in one or more embodiments of the present invention. Optical elements 502-1 to 502-5 may be asymmetrical spreading lenses arranged to avoid a spotty appearance by directing additional light into the spaces between LEDs 302-1 to 302-5 once leadframe assembly 202 is stretched out. Asymmetrical spreading lenses 502-1 to 502-5 may be bidirectional spreading lenses that direct additional light along the length of a stretched leadframe assembly 202 to mitigate dark regions between LEDs 302-1 to 302-5. Bidirectional spreading lenses 502-1 to 502-5 may have the shape of two intersecting half parabolas.

Bidirectional spreading lens 502-1 directs more light in opposite directions along a spreading axis 504-1 than a null axis perpendicular to the spreading axis. Bidirectional spreading lens 502-1 is pre-rotated so spreading axis 504-1 would rotate and align along a desired direction, such as a "stretch" axis 606 (FIG. 6A) along the length of a leadframe assembly 202 after the leadframe assembly 202 has been stretched (see FIG. 7).

The amount of pre-rotation depends on the geometry of leadframe assembly 202, including the interconnect pattern, the interconnect attachment points to the leadframes, and stretch hole locations, and the final length of the stretched leadframe assembly. For the geometry of leadframe 202 shown in FIG. 5, spreading axis 504-1 is substantially parallel to a "pulling" axis 509 and pre-rotated about 45 degrees from a "row" axis 508 when leadframe assembly 202 is a typical square shape. Pulling axis 509 may be a line that passes through two stretch holes 214 and 220 along which leadframe assembly 202 is stretched after sacrificial ties 221 have been removed. Row axis 508 is a line that passes through LEDs 302-1 to 302-5 on leadframes 210-1 to 210-5 before leadframe assembly 202 is stretched.

However, spreading axis 504-1 may be angled relative to both pulling axis 509 and row axis 508 in other embodiments, depending on the geometry of the leadframe assembly 202 and the final length of the stretched leadframe assembly. In each embodiment the spreading axis is arranged to align along a desired direction after stretching the leadframe assembly in order to distribute light uniformly in a final product.

Bidirectional spreading lenses 502-2 to 502-5 are configured similarly to bidirectional spreading lens 502-1.

Figure 6A:
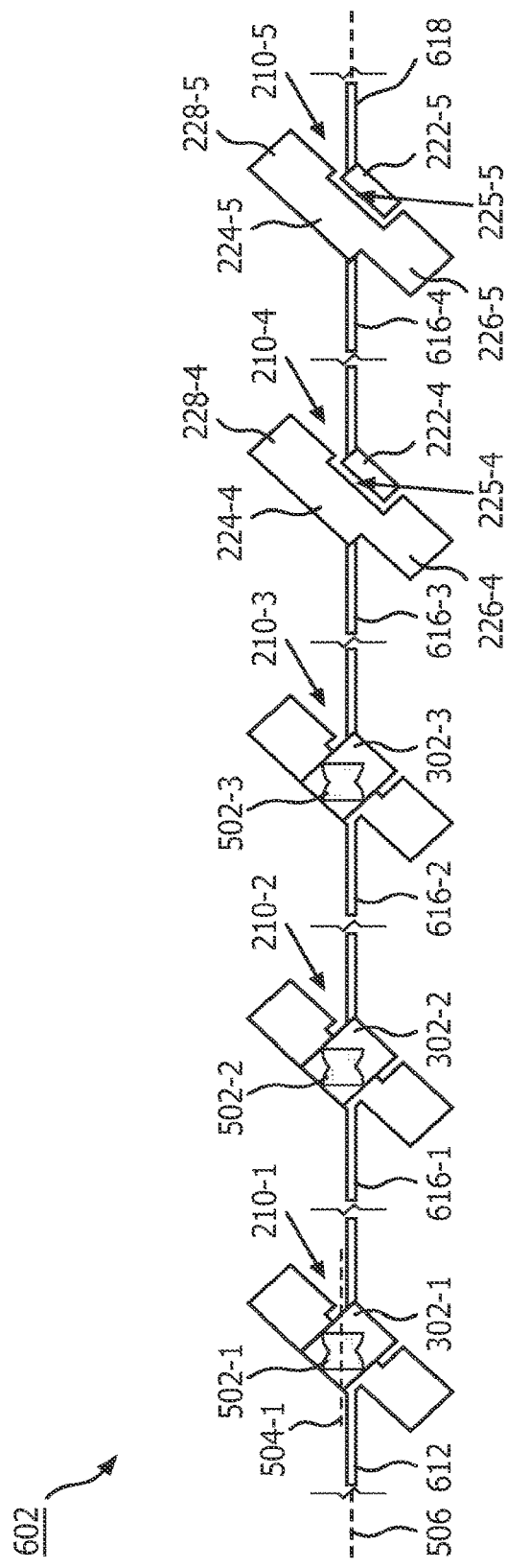
FIG. 6A is a top view of the stretched leadframe assembly of FIG. 5.

FIG. 6A shows a stretched leadframe assembly 602 in one or more embodiments of the present invention. In the stretched configuration, folded interconnects 212, 216-1, 216-2, 216-3, 216-4, and 218 (FIG. 2A) are stretched to form substantially straight interconnects 612, 616-1, 616-2, 616-3, 616-4, and 618, respectively. Interconnect 612 is the unfolded, folded interconnect 212, which includes vertical segment 212-1 (FIGS. 2B and 2C) and top folded section 232-1. One end of interconnect 612 is connected to the anode of leadframe 210-1.

Interconnect 616-1 is the unfolded, folded interconnect 216-1, which includes bottom folded section 235-1, vertical segment 236-1, and top folded section 239-1 (FIG. 2B). One end of interconnect 616-1 is connected to the cathode of leadframe 210-1 and the other end is connected to the anode of leadframe 210-2. The other leadframes 210-2 to 210-5 are connected in a similar manner. Although folded interconnects 212, 216-1 to 216-4, and 218 are shown as substantially straight interconnects after stretching leadframe assembly 202, interconnects 612, 616-1 to 616-4, and 618 may be slightly bent in some embodiments. In the alternative some portions of some interconnect segments may have kinks or lumps.

After stretching, LEDs 302-1 to 302-5 (only LEDs 302-1 to 302-3 with the accompanying lenses 502-1, 502-2 and 502-3 are shown) are located along stretch axis 606. As can be seen, spreading axis 504-1 of bidirectional spreading lens 502-1 is now aligned with stretch axis 606 along the length of leadframe assembly 602. Bidirectional spreading lenses 502-2 to 502-5 are oriented in a similar manner as bidirectional spreading lens 502-1 so the bidirectional spreading lenses direct additional light from LEDs 302-1 to 302-5 along the length of leadframe assembly 602 to mitigate dark regions between the LEDs.

Figure 6B:
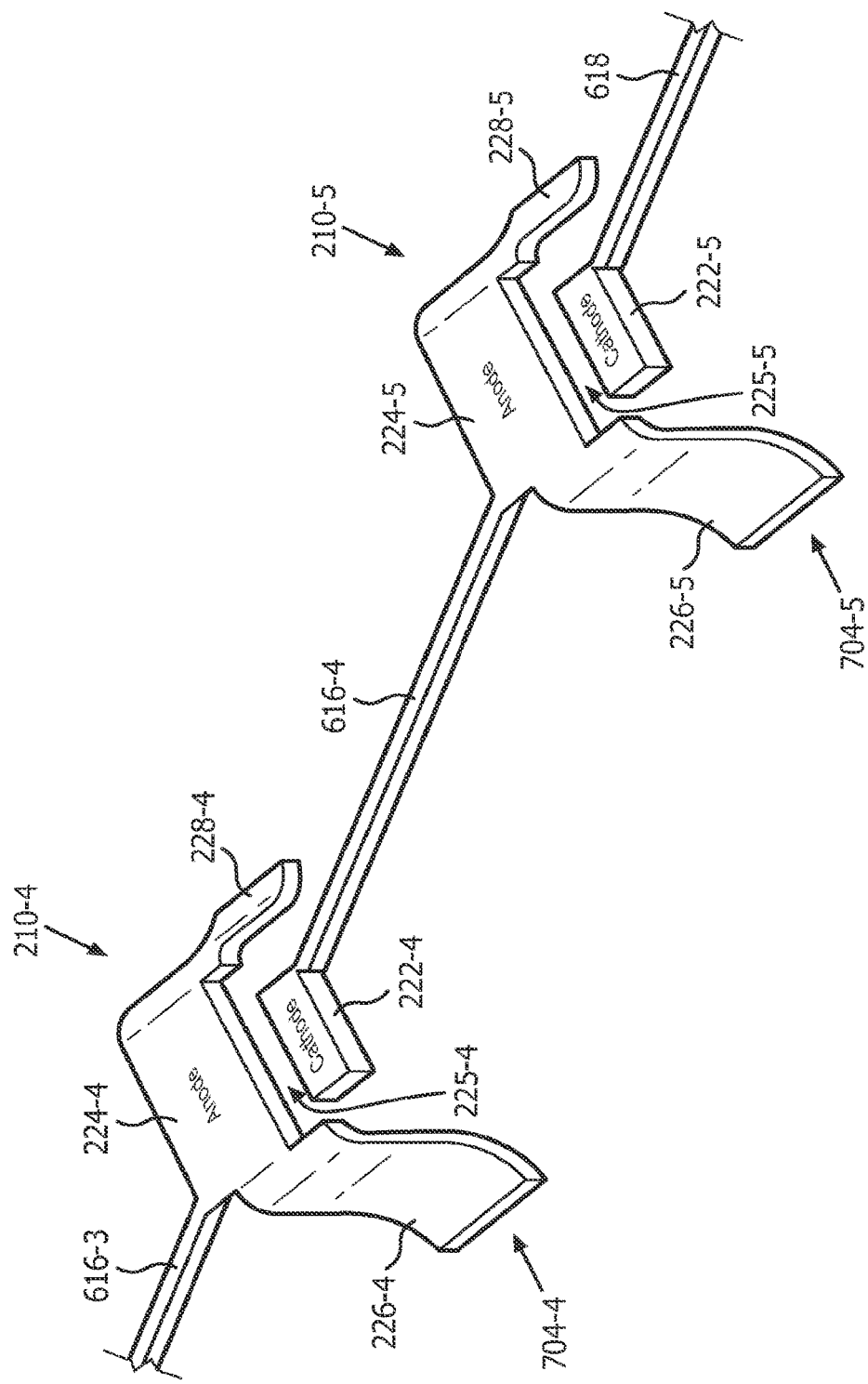
FIG. 6B is an isometric view of a portion of the stretched leadframe assembly of FIG. 6A.

LED 302-4, bidirectional lens 502-4, LED 302-5, and bidirectional lens 502-5 are omitted from FIG. 6A to expose leadframes 210-4 and 210-5. Leadframe 210-4 includes cathode pad 222-4 and anode pad 224-4 with wing areas 226-4 and 228-4. Cathode pad 222-4 and anode pad 224-4 are electrically insulated from each other by a cutout or gap 225-4. Once LED 302-4 (FIG. 5) is mounted on cathode pad 222-4 and anode pad 224-4, the pads are physically and electrically connected by the LED. Similarly leadframe 210-5 includes cathode pad 222-5 and anode pad 224-5 with wing areas 226-5 and 228-5. Cathode pad 222-5 and anode pad 224-5 are electrically insulated from each other by a cutout or gap 225-5. Once LED 302-5 (FIG. 5) is mounted on cathode pad 222-5 and anode pad 224-5, the pads are physically and electrically connected by the LED. FIG. 6B shows that wing areas 226-4 and 228-4 of anode 224-4 are bent to form a mount 704-4 for leadframe 210-4, and wing areas 226-5 and 228-5 of anode 224-5 are bent to form a mount 704-5 for leadframe 210-5 in one or more embodiments of the present invention.

Figure 7A:
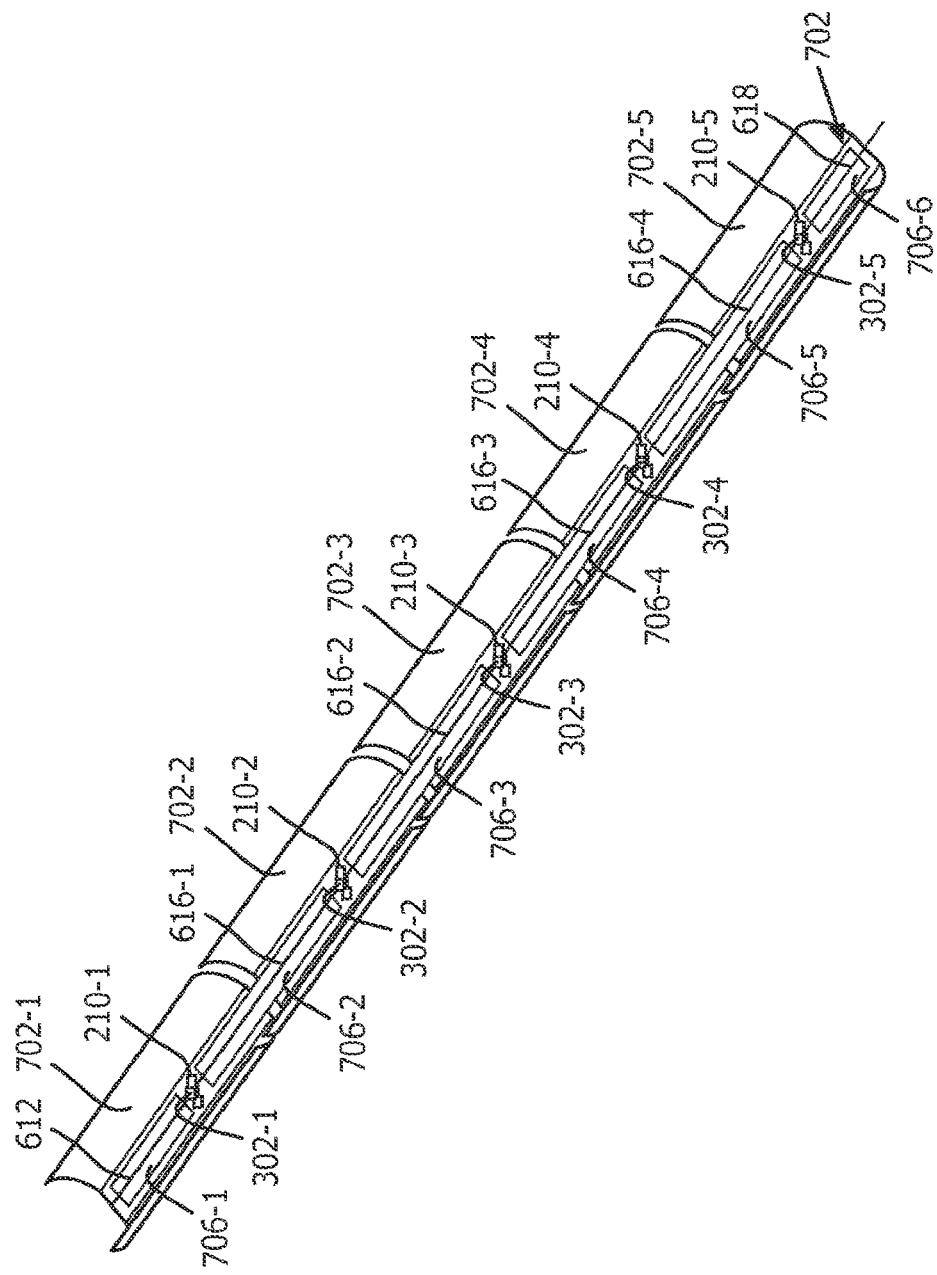
FIG. 7A is an isometric view of the stretched leadframe assembly of FIG. 6A fixed relative to reflectors with one configuration of insulating strips between the reflectors.

FIG. 7A shows an embodiment of a stretched leadframe assembly 702 oriented relative to reflectors 702-1, 702-2, 702-3, 702-4, and 702-5 in one or more embodiments of the present invention. Reflectors 702-1 to 702-5 are arranged to avoid a spotty appearance in the resulting tube light by reflecting light from LEDs 302-1 to 302-5 in a predetermined, uniform spread pattern to provide the appearance of a single, uniformly lit light source. Reflectors 702-1 to 702-5 also act as heat sinks to dissipate heat away from LEDs 302-1 to 302-5.

Leadframe assembly 702 is arranged relative to reflectors 702-1 to 702-5 as follows. Reflectors 702-1 to 702-5 may be metal sheets that are at least partially curved. Adjacent reflectors are separated by a small gap. Interconnect 612 is suspended over part of reflector 702-1 and has its rightmost end connected to leadframe 210-1. Leadframe 210-1 with LED 302-1 is mounted near the centroid of reflector 702-1. Interconnect 616-1 is suspended over reflectors 702-1, 702-2, has its leftmost end connected to leadframe 210-1, and has its rightmost end connected to leadframe 210-2. Leadframe 210-2 with LED 302-2 is mounted near the centroid of reflector 702-2. Interconnect 616-2 is suspended over reflectors 702-2, 702-3, has its leftmost end connected to leadframe 210-2, and has its rightmost end connected to leadframe 210-3. Leadframe 210-3 with LED 302-3 is mounted near the centroid of reflector 702-3. Interconnect 616-3 is suspended over reflectors 702-3, 702-4, has its leftmost end connected to leadframe 210-3, and has its rightmost end connected to leadframe 210-4. Leadframe 210-4 with LED 302-4 is mounted near the centroid of reflector 702-4. Interconnect 616-4 is suspended over reflectors 702-4, 702-5, has its leftmost end connected to leadframe 210-4, and has its rightmost end connected to leadframe 210-5. Leadframe 210-5 with LED 302-5 is mounted near the centroid of reflector 702-5. Interconnect 618 is suspended over part of reflector 702-5 and has its leftmost end connected to leadframe 210-5.

In FIG. 7B, two sections consisting of leadframe 210-1, LED 302-1, reflector 702-1, leadframe 210-2, LED 302-2, and reflector 702-2 are shown in one or more embodiments of the present invention. Wing areas 226-1 and 228-1 of anode 224-1 (FIGS. 2B and 2C) on leadframe 210-1 are bent to form a gull wing mount 704-1 that fixes leadframe 210-1 to reflector 702-1. Mount 704-1 suspends one end of interconnects 612 and 616-1 above reflector 702-1, thereby avoiding a possible short of interconnects 612 and 616-1 to reflector 702-1. Wing areas 226-2 and 228-2 of anode 224-2 (FIGS. 2B and 2C) on leadframe 210-2 are bent to form a gull wing mount 704-2 that fixes leadframe 210-2 to reflector 702-2. Mount 704-2 suspends one end of interconnects 616-1 and 616-2 above reflector 702-2, thereby avoiding a possible short of interconnects 612 and 616-1 to reflector 702-1. Other sections are similarly configured. Referring back to FIG. 7A, insulating strips 706-1, 706-2, 706-3, 706-4, 706-5, and 706-6 are provided along the length of reflectors 702-1 to 702-5 across the gap between adjacent reflectors to prevent a short between interconnects 612, 616-1 to 616-4, 618 and reflectors 702-1 to 702-5. Insulating strip 706-1 is fixed under interconnect 612 and covers a left portion of reflector 702-1. Insulating strip 706-2 is fixed under interconnects 616-1 and covers a right portion of reflector 702-1 and a left portion of reflector 702-2. Insulating strips 706-3, 706-4, and 706-5 are configured similarly to insulating strip 706-2. Insulating strip 706-6 is fixed under interconnect 618 and covers a right portion of reflector 702-5.

Figure 8:
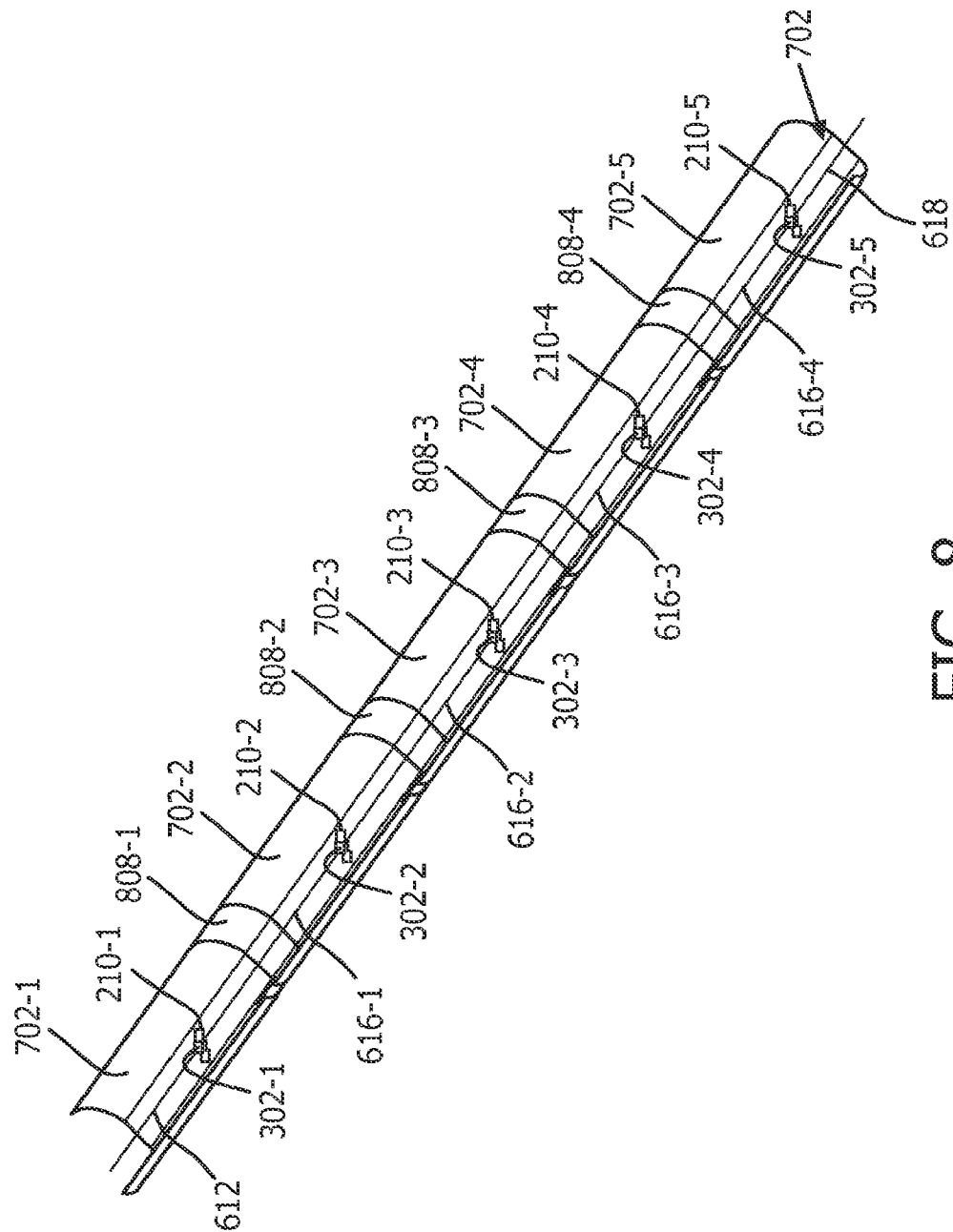
FIG. 8 is an isometric view of the stretched leadframe assembly of FIG. 6A fixed relative to the reflectors with a different configuration of insulating strips between the reflectors.

Alternatively, as shown in FIG. 8, insulating strips 808-1, 808-2, 808-3, and 808-4, are provided along the width of reflectors 702-1 to 702-5 along the gap between adjacent reflectors. Insulating strip 808-1 is fixed over the gap between reflectors 702-1 and 702-2. Insulating strips 808-2 to 808-4 are configured similarly to insulating strip 808-1. Once leadframe assembly 702 is fixed relative to reflectors 702-1 to 702-5, they may be inserted into a tube lamp.

Figure 9:
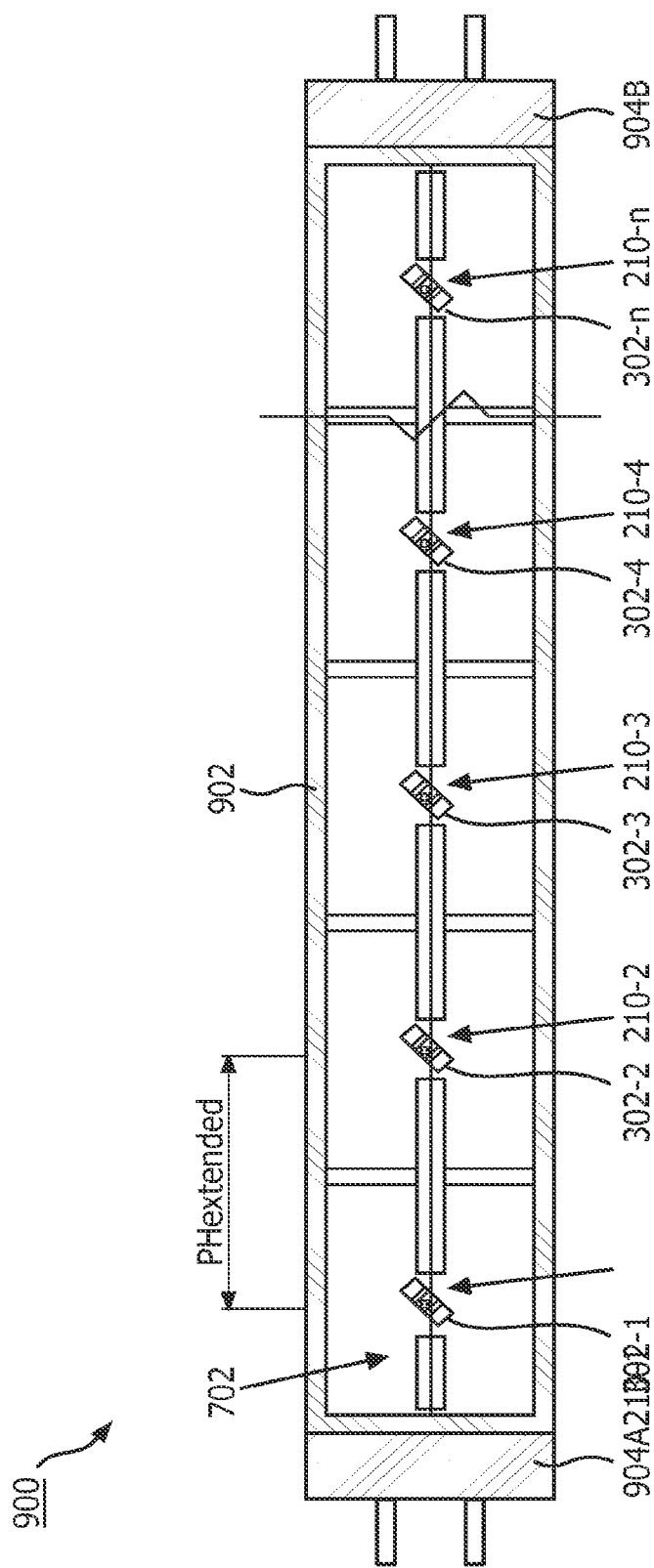
FIG. 9 is a top cutaway view of a tube lamp with the stretched leadframe assembly and the reflectors of FIG. 7A.

FIG. 9 is a top cutaway view of a tube lamp 900 in one or more embodiments of the present invention. When tube lamp 900 is applied as a LED retrofit tube lamp, it has the form factor of a standard straight fluorescent tube lamp. For this application, tube lamp 900 includes a transparent tube 902 (e.g., glass or plastic) and bi-pin connectors 904A, 904B mounted on the two ends of the transparent tube so the tube lamp can connect to standard fluorescent lighting fixtures. Tube lamp 900 may also include electronics to drive LEDs 302-1 to 302-$n$ (where n is a variable) from AC power. Tube lamp 900 may have other form factors depending on the application.

LEDs 302-1 to 302-*n* on leadframes 210-1 to 210-*n* are spaced with a horizontal pitch PHextended that is larger than horizontal pitch PHfolded (FIG. 3). Horizontal pitch PHextended may be twice the size of horizontal pitch PHfolded or larger. With horizontal pitch PHextended of about 1 inch between LEDs 302-1 to 302-*n*, 47, 48 or 49 LEDs are required for a 4-foot long tube lamp 900. Note that pitch PHextended varies depending on application.

A comparison between FIGS. 1 and 9 shows that tube lamp 900 uses a smaller number of LEDs than tube lamp 100. As LEDs 302-1 to 302-*n* are mounted on leadframe assembly 202, they may use chip scale packaging to reduce the die size. Furthermore, leadframe assembly 202 uses less material than PCB 108. As will be described later, the manufacturing of tube lamp 900 using leadframe assembly 202 can be efficiently performed on a large scale.

Figure 10:
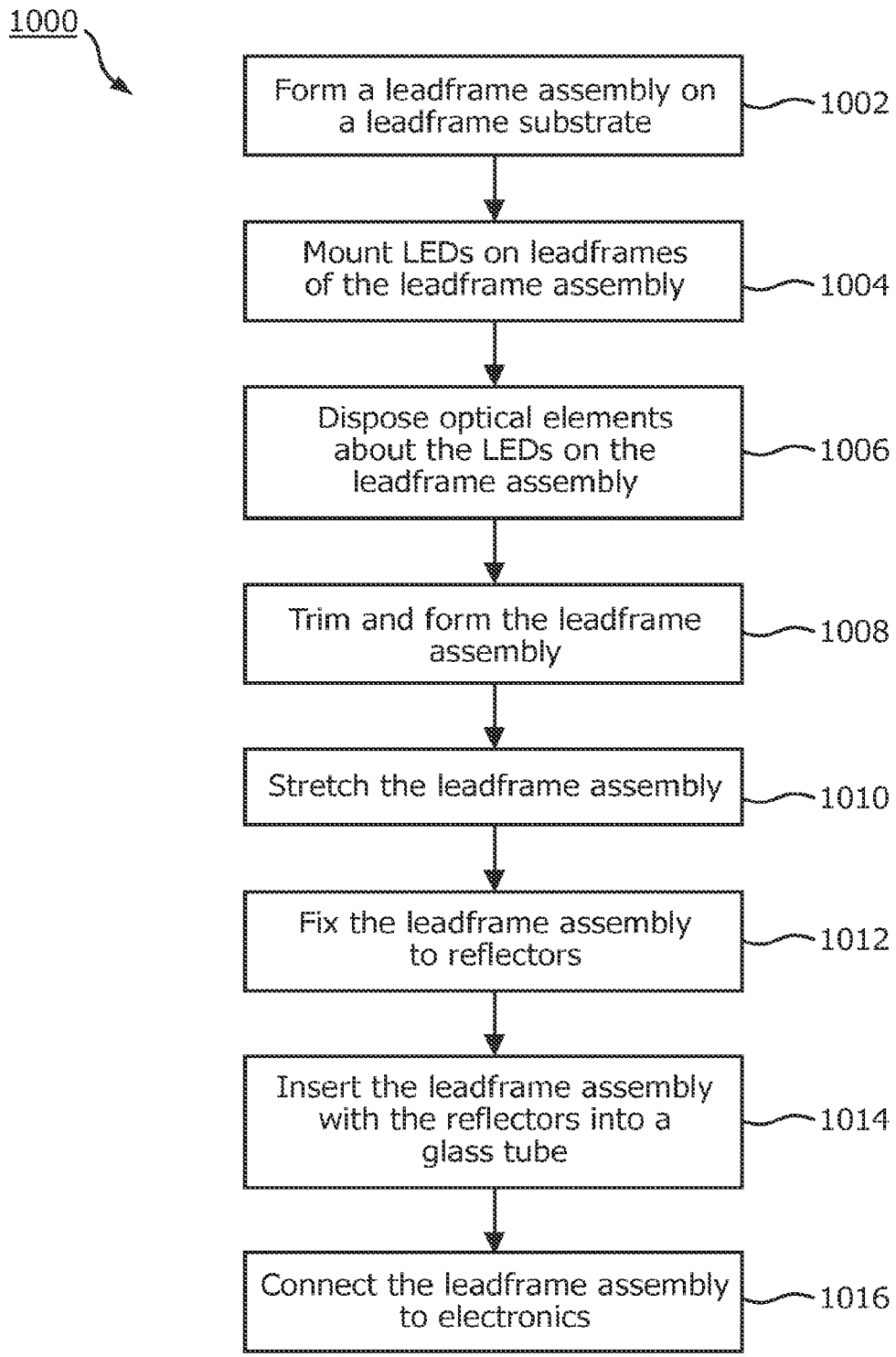
FIG. 10 is a flowchart of a method for manufacturing the tube lamp of FIG. 9.

FIG. 10 is an exemplary flowchart of a method 1000 for manufacturing tube lamp 900 in one or more embodiments of the present invention. Method 1000 may include one or more operations, functions, or actions as illustrated by one or more blocks. Although the blocks are illustrated in a sequential order, these blocks may also be performed in parallel, and/or in a different order than those described herein. Also, the various blocks may be combined into fewer blocks, divided into additional blocks, and/or eliminated based upon the desired implementation. Method 1000 is explained with the help of the other figures showing progression through the method.

Method 1000 may begin in block 1002. In block 1002, a leadframe assembly is formed. The leadframe assembly is stamped or etched from a leadframe substrate such as a copper or aluminum sheet. Block 1002 may be followed by block 1004.

In block 1004, LEDs are mounted on the leadframes in the leadframe assembly. Solder paste may be applied to the cathode and the anode pads of the leadframes by screen printing. The LEDs are picked and placed onto the leadframes. The LEDs are then permanently soldered to the leadframes by solder reflow. Block 1004 may be followed by block 1006.

In block 1006, optical elements, such as bidirectional spreading lenses, are disposed about corresponding LEDs on the leadframe assemblies. Each bidirectional spreading lens is pre-rotated so its spread axis would rotate and align along a desired direction after the leadframe assembly is stretched. The amount of pre-rotation is determined according to the geometry of the leadframe assembly and the final length of the stretched leadframe assembly.

The bidirectional spreading lenses may be directly molded over the LEDs. Multiple bidirectional spreading lenses may be injection molded in parallel on the LEDs. The lens material may also serve to encapsulate exposed surface areas of the LEDs. Alternatively the bidirectional spreading lenses may be preformed, applied with adhesive, and picked and placed onto the LEDs. Block 1006 may be followed by block 1008.

In block 1008, the leadframe assembly is trimmed and formed. Specifically, the wing areas of the anode pads are bent to form the gull wing mounts, and sacrificial ties are severed to free the leadframe assembly from the leadframe substrate and the interconnects and the leadframes from each other. Block 1008 may be followed by block 1010.

In block 1010, the leadframe assembly is stretched. Block 1010 may be followed by block 1012.

In block 1012, the stretched leadframe assembly is fixed relative to reflectors with or without insulating strips. Block 1012 may be followed by block 1014.

In block 1014, the stretched leadframe assembly fixed to the reflectors is inserted into a transparent tube. Block 1014 may be followed by block 1016.

In block 1016, the terminal interconnects of the leadframe assembly are connected to electronics, which are connected to bi-pin connectors mounted to the ends of the glass tube.

Figure 11:
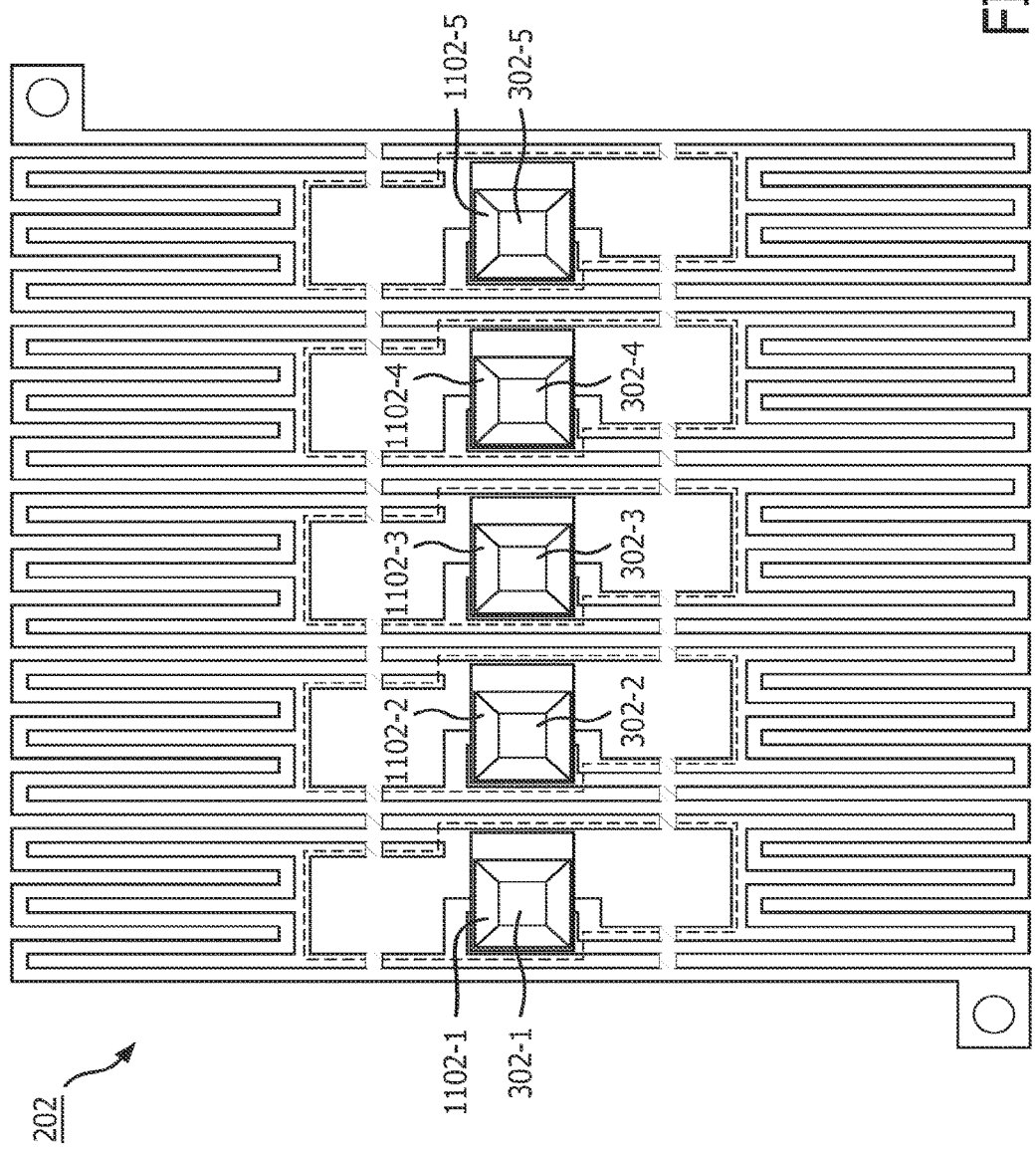
FIG. 11 is a top view of a different type of optical elements disposed about the LEDs on the leadframe assembly of FIG. 3.

Other types of optical elements may be used with the LEDs on a leadframe assembly. FIG. 11 shows a top view of leadframe assembly 202 with optical elements 1102-1, 1102-2, 1102-3, 1102-4, and 1102-5 that are reflector cups in one or more embodiments of the present invention. Reflector cup 1102-1 is disposed around LED 302-1. Reflector cups 1102-2 to 1102-5 are configured similarly around LEDs 302-2 to 302-5.

Figure 12:
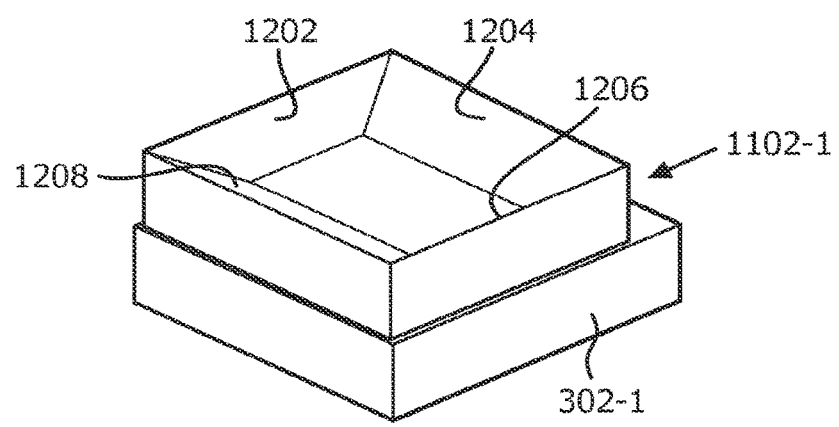
FIG. 12 is an isometric view of a reflector cup mounted on an LED.
Figure 13:
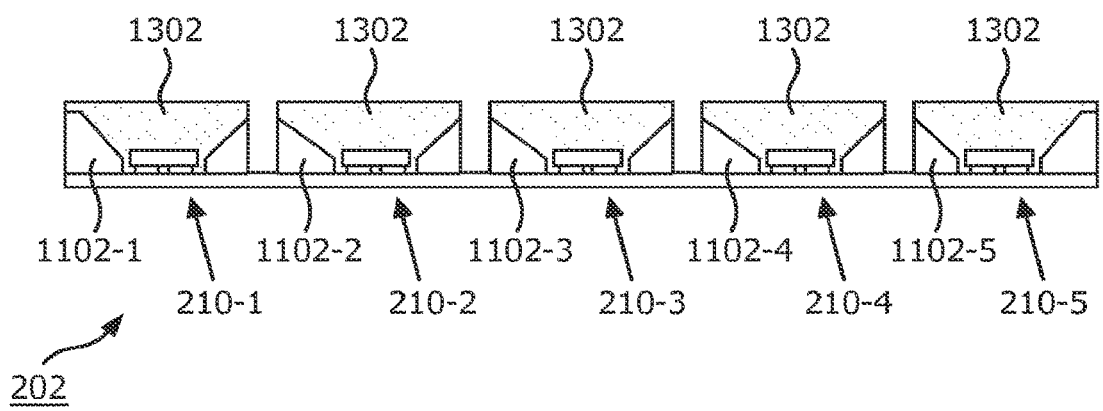
FIG. 13 is a side cross-sectional view of the optical elements disposed about the LEDs on the leadframe assembly of FIG. 11.

FIG. 12 shows reflector cup 1102-1 includes a set of planar sidewalls 1202, 1204, 1206, and 1208 that are angled with respect to LED 302-1 to extract and direct light from the LED. Alternatively reflector cup 1102-1 has a curved surface centered about LED 302-1. FIG. 13 shows an encapsulant 1302 may fill reflectors cups 1102-1 to 1102-5 to fix them to LEDs 302-1 to 302-5 and/or provide an index matching medium for the light emitted by the LEDs.

Reflector cups 1102-1 to 1102-5 may be directly molded on LEDs 302-1 to 302-5. Reflector cups 1102-1 to 1102-5 may be injection molded in parallel around LEDs 302-1 to 302-5 on leadframe assembly 202. Alternatively individual or a frame of reflector cups 1102-1 to 1102-5 may be preformed, applied with adhesive, and picked and placed around LEDs 302-1 to 302-5. If a frame of reflector cups 1102-1 to 1102-5 is used, the reflector cups may be singulated as part of the trim and bend process in block 1008.

Figure 14:
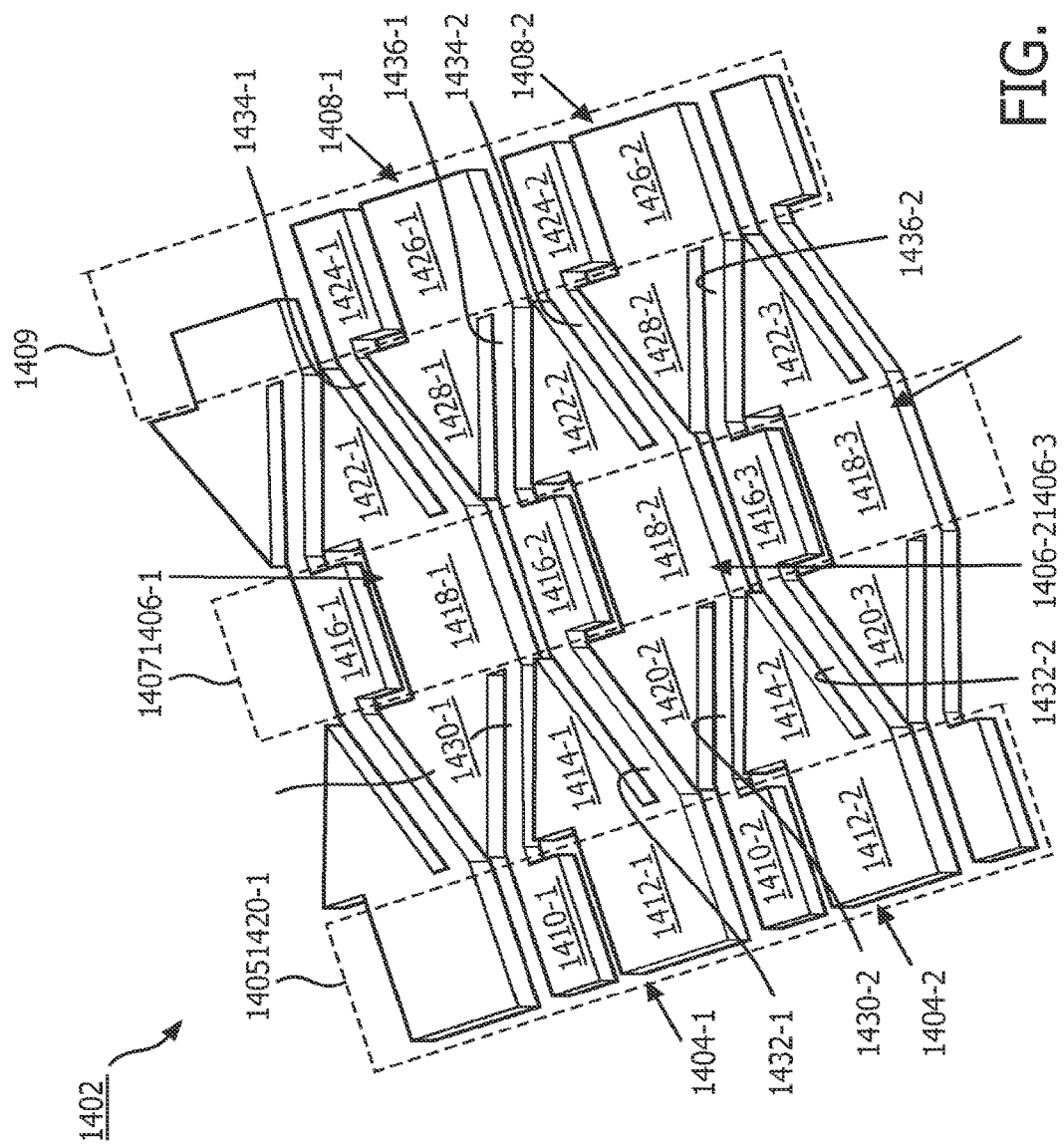
FIG. 14 is an isometric view of a leadframe assembly with three rows of leadframes.

Other types of leadframe assembly may be used for tube lamp 900. FIG. 14 shows an isometric view of a leadframe assembly 1402 in one or more embodiments of the present invention. Leadframe assembly 1402 has three groups of linearly arranged leadframes. A left column of leadframes 1404-1 and 1404-2 is generally indicated by a phantom box 1405, a middle column of leadframes 1406-1, 1406-2, and 1406-3 is generally indicated by a phantom box 1407, and a right column of leadframes 1408-1 and 1408-2 is generally indicated by a phantom box 1409. Leadframes 1406-1 to 1406-3 in middle column 1407 are staggered from leadframes 1404-1, 1404-2 in left column 1405 and leadframes 1408-1, 1408-2 in right column 1409.

Leadframe 1404-1 includes a rectangular cathode pad 1410-1, a rectangular anode pad 1412-1, and a triangular wing 1414-1 extending inward from one edge of the anode pad. Leadframe 1404-2 is configured similarly to leadframe 1404-1.

Leadframe 1406-1 includes a rectangular cathode pad 1416-1, a rectangular anode pad 1418-1, and triangular wings 1420-1, 1422-1 extending from the two edges of the anode pad. Leadframes 1406-2 and 1406-3 are configured similarly to leadframe 1406-1.

Leadframe 1408-1 includes a rectangular cathode pad 1424-1, a rectangular anode pad 1426-1, and a triangular wing 1428-1 extending inward from one edge of the anode pad. Leadframe 1408-2 is configured similarly to leadframe 1408-1.

Wings 1414-1, 1414-2 are interdigitated with wings 1420-1, 1420-2, 1420-3, and wings 1428-1, 1428-2 are interdigitated with wings 1422-1, 1422-2, and 1422-3. Wings 1414-1, 1414-2, 1420-1 to 1420-3, 1422-1 to 1422-3, 1424-1, and 1424-2 are later bent to form mounts.

An interconnect 1430-1 passes between wings 1414-1 and 1420-1 to connect cathode pad 1410-1 to anode pad 1418-1. An interconnect 1432-1 passes between wings 1414-1 and 1420-2 to connect anode pad 1412-1 to cathode pad 1416-2. An interconnect 1430-2 passes between wings 1414-2 and 1420-2 to connect cathode pad 1410-2 to anode pad 1418-2. An interconnect 1432-2 passes between wings 1414-2 and 1420-3 to connect anode pad 1412-2 to cathode pad 1416-3.

An interconnect 1434-1 passes between wings 1422-1 and 1428-1 to connect cathode pad 1424-1 to anode pad 1418-1. An interconnect 1436-1 passes between wings 1428-1 and 1422-2 to connect anode pad 1426-1 to cathode pad 1416-2. An interconnect 1434-2 passes between wings 1422-2 and 1428-2 to connect cathode pad 1424-2 to anode pad 1418-2. An interconnect 1436-2 passes between wings 1428-2 and 1422-3 to connect anode pad 1426-2 to cathode pad 1416-3.

Figure 15:
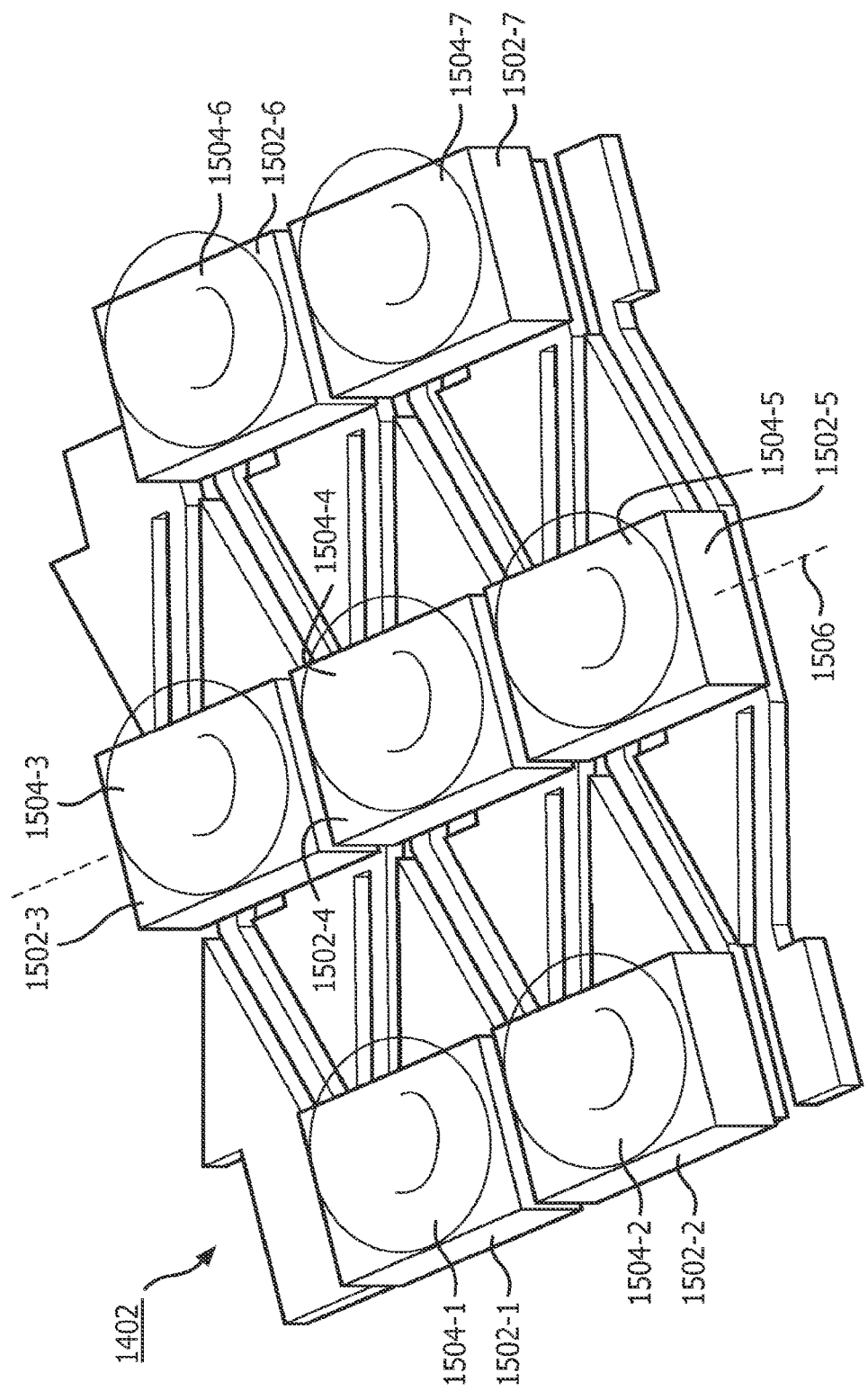
FIG. 15 is an isometric view of LEDs and optical elements on the leadframe assembly of FIG. 14.
Figure 16:
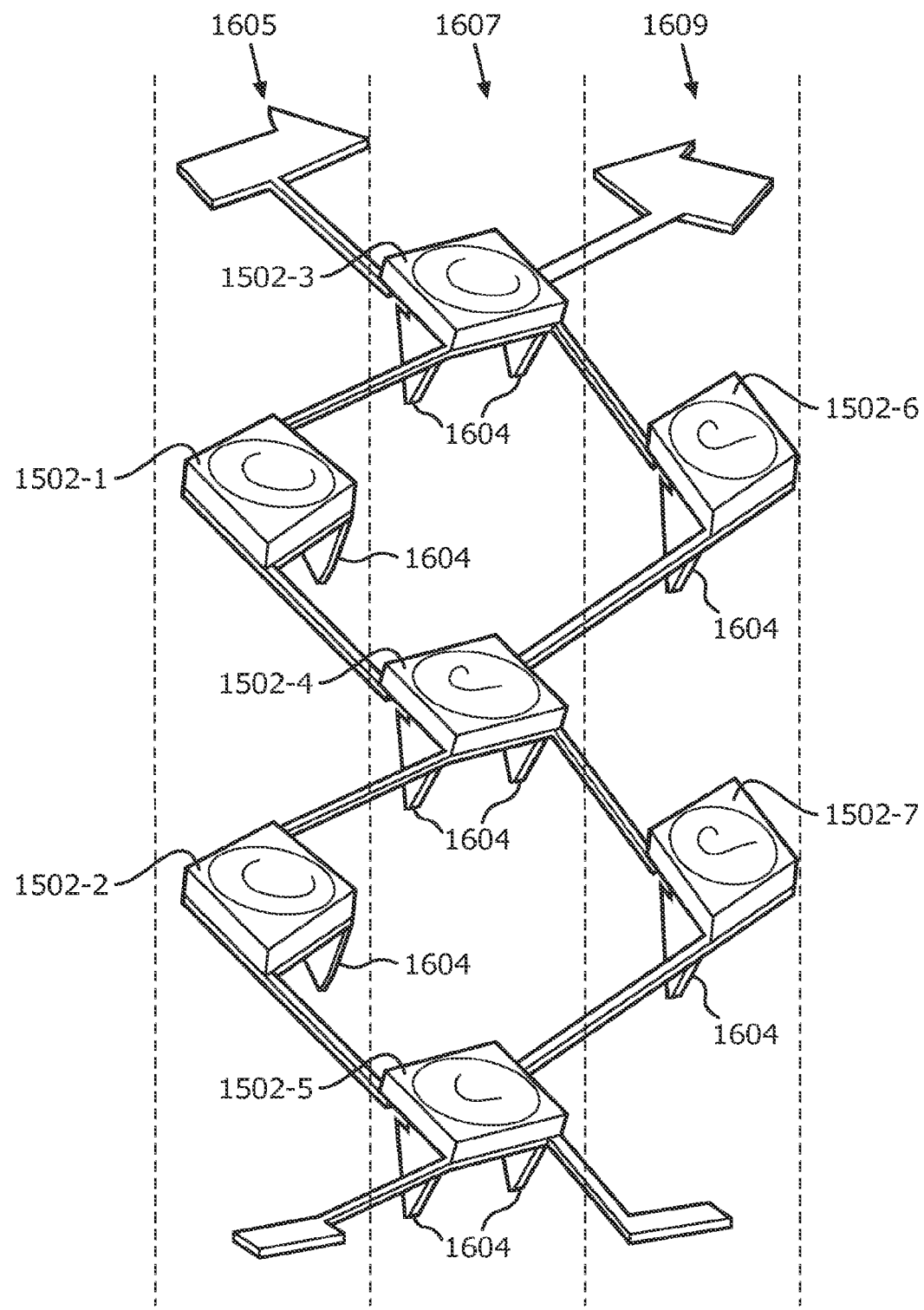
FIG. 16 is an isometric view of the leadframe assembly of FIG. 15 after stretching, all arranged in accordance with embodiments of the invention.

As shown in FIG. 15, LEDs 1502-1, 1502-2, 1502-3, 1502-4, 1502-5, 1502-6, and 1502-7 are soldered or otherwise fixed on leadframes 1404-1, 1404-2, 1406-1 to 1406-3, 1408-1, and 1408-2, respectively. Optical elements 1504-1, 1504-2, 1504-3, 1504-4, 1504-5, 1504-6, and 1504-7 are then disposed on LEDs 1502-1 to 1502-7, respectively. Each optical element may be a low dome lens (also known as a "batwing" lens) that spreads light in all directions to fill in areas between adjacent rows of LEDs 1502-1 to 1502-7. Leadframe assembly 1402 is stretched in opposite directions along a stretch axis 1506 to space out LEDs 1502-1 to 1502-7 as shown in FIG. 16. LEDs 1502-1 and 1502-2 are located in a left column 1605, LEDs 1502-3 to 1502-5 are located in a middle column 1607, and LEDs 1502-6 and 1502-7 are located in a right column 1609. Stretched leadframe assembly 1602 may be fixed by mounts 1604 on reflectors and placed in a transparent tube of a tube lamp.

Anode 1418-1 (FIG. 14) of LED 1502-3 is connected in parallel to cathodes 1410-1 and 1424-1 (FIG. 14) of LEDs 1502-1 and 1502-6, respectively. Anodes 1412-1 and 1426-1 (FIG. 14) of LEDs 1502-1 and 1502-6, respectively, are connected to cathode 1416-2 (FIG. 14) of LED 1502-4. Anode 1418-2 (FIG. 14) of LED 1502-4 is connected in parallel to cathodes o1410-2 and 1424-2 (FIG. 14) of LEDs 1502-2 and 1502-7, respectively. Anodes 1412-2 and 1426-2 (FIG. 14) of LEDs 1502-2 and 1502-7, respectively are connected to cathode 1416-3 (FIG. 14) of LED 1502-5.

Various other adaptations and combinations of features of the embodiments disclosed are within the scope of the invention. For example, tube lamp 900 may have the form factor of a standard circline or U-shape fluorescent tube lamp. As interconnects 212, 216-1 to 216-4, and 218 are flexible, a stretched leadframe assembly 602 may conform to the shape of the tube lamp. Instead of light-emitting diodes, other light sources such as lasers may be used. A large leadframe assembly may be constructed by combining leadframe assemblies 202 that are connected by cross bars in parallel. Each leadframe may have a single die attach pad for receiving a light source, which has bond pads connected by wire bonds to the corresponding interconnects. Numerous embodiments are encompassed by the following claims.

What is claimed is:

1. A solid state light-emitting device (LED) lighting apparatus, comprising:
    a stretched leadframe assembly, comprising:
        leadframes spaced apart at a pitch, each leadframe comprising at least one pad;
        interconnects each linking two adjacent leadframes;
        LEDs mounted on the leadframes; and
    bidirectional spreading lenses disposed about the LEDs, each bidirectional spreading lens having a spreading axis and a null axis perpendicular to the spreading axis, each bidirectional spreading lens directing more light in opposite directions along the spreading axis than the null axis,
    the spreading axis being aligned along the length of the stretched leadframe assembly.

2. The apparatus of claim 1, wherein the bidirectional spreading lenses comprise reflector cups around the LEDs and an encapsulant in the reflector cups.

3. The apparatus of claim 1, further comprising one or more reflectors, the stretched leadframe assembly being fixed relative to the one or more reflectors.

4. The apparatus of claim 3, further comprising insulating strips over gaps between adjacent reflectors.

5. The apparatus of claim 4, wherein the insulating strips are provided along the length of the reflectors.

6. The apparatus of claim 4, wherein the insulating strips are provided along the width of the reflectors.

7. The apparatus of claim 1, wherein the LEDs are prepackaged light-emitting diodes or naked light-emitting diode dice.

8. The apparatus of claim 1, wherein each leadframe comprises a cathode pad and an anode pad.

9. The apparatus of claim 8, wherein the anode pad has wing areas bent to form a mount for the leadframe.

10. The apparatus of claim 1, wherein the interconnects are substantially straight.

11. The apparatus of claim 1, wherein the interconnects are slightly bent.

* * * * *